(12) United States Patent
Kang et al.

(10) Patent No.: US 9,611,545 B2
(45) Date of Patent: Apr. 4, 2017

(54) ZNO FILM PRODUCTION SYSTEM AND PRODUCTION METHOD USING ZNO FILM PRODUCTION SYSTEM HAVING HEATING UNITS AND CONTROL DEVICE

(71) Applicants: TOKYO ELECTRON LIMITED, Tokyo (JP); NATIONAL UNIVERSITY CORPORATION TOKYO UNIVERSITY OF AGRICULTURE AND TECHNOLOGY, Tokyo (JP)

(72) Inventors: Song yun Kang, Tokyo (JP); Yoshinao Kumagai, Tokyo (JP); Akinori Koukitu, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 12 days.

(21) Appl. No.: 14/417,196

(22) PCT Filed: Jun. 19, 2013

(86) PCT No.: PCT/JP2013/066863
§ 371 (c)(1),
(2) Date: Jan. 26, 2015

(87) PCT Pub. No.: WO2014/017229
PCT Pub. Date: Jan. 30, 2014

(65) Prior Publication Data
US 2015/0225846 A1    Aug. 13, 2015

(30) Foreign Application Priority Data

Jul. 27, 2012   (JP) ................................. 2012-167481

(51) Int. Cl.
*C23C 16/40*    (2006.01)
*B05C 19/06*   (2006.01)
(Continued)

(52) U.S. Cl.
CPC ............ *C23C 16/407* (2013.01); *B05C 19/06* (2013.01); *C23C 16/4488* (2013.01);
(Continued)

(58) Field of Classification Search
CPC ................ C23C 16/407; C23C 16/448; H01L 21/02554; H01L 21/0262; H01L 31/02168; B05C 9/06; B05C 19/06; B05C 11/1013
See application file for complete search history.

(56) References Cited

U.S. PATENT DOCUMENTS

| 3,979,235 A | * | 9/1976 | Boucher | ................. C30B 25/14 |
| | | | | 117/102 |
| 4,859,625 A | * | 8/1989 | Matsumoto | ............. C30B 25/02 |
| | | | | 117/103 |

(Continued)

FOREIGN PATENT DOCUMENTS

| JP | 2001-270799 A | 10/2001 |
| JP | 2008-243987 A | 10/2008 |

OTHER PUBLICATIONS

International Search Report issued in PCT/JP2013/066863 dated Aug. 27, 2013 (Aug. 27, 2013), 1 page.

*Primary Examiner* — Karl Kurple
(74) *Attorney, Agent, or Firm* — Nath, Goldberg & Meyer; Jerald L. Meyer

(57) ABSTRACT

A ZnO film production method includes: disposing a substrate on an installation base; and, while supplying chlorine gas from a chlorine gas supply source to a first raw material storing part R1 and supplying oxygen gas from a third gas supply source (oxygen gas supply source) G3 into a reaction container, controlling heating units (heaters H1, H2 and H3) with a control device CONT such that temperature T1 of the first raw material storing part R1, temperature T2 of a second raw material storing part R2 and temperature T3 of the
(Continued)

installation base on which the substrate is disposed satisfy a relationship of T1<T2<T3. Thus, according to the production method of the present disclosure, it is possible to produce a high-quality ZnO film.

5 Claims, 24 Drawing Sheets

(51) Int. Cl.
　　*C23C 16/448* 　　(2006.01)
　　*H01L 21/02* 　　(2006.01)
　　*C23C 16/52* 　　(2006.01)
(52) U.S. Cl.
　　CPC .......... *C23C 16/52* (2013.01); *H01L 21/0262* (2013.01); *H01L 21/02554* (2013.01)

(56) References Cited

U.S. PATENT DOCUMENTS

| | | | |
|---|---|---|---|
| 5,225,366 A * | 7/1993 | Yoder | C30B 25/02 117/90 |
| 5,229,319 A * | 7/1993 | Kawakyu | C23C 16/45525 117/102 |
| 5,750,188 A * | 5/1998 | Menu | C09K 11/0811 427/126.3 |
| 6,656,285 B1 * | 12/2003 | Melnik | C30B 25/00 118/726 |
| 6,846,516 B2 * | 1/2005 | Yang | C23C 16/45531 427/255.32 |
| 6,936,357 B2 * | 8/2005 | Melnik | C30B 25/00 117/952 |
| 6,955,719 B2 * | 10/2005 | Dmitriev | C23C 16/303 117/107 |
| 7,501,023 B2 * | 3/2009 | Dmitriev | C30B 25/00 117/106 |
| 7,754,013 B2 * | 7/2010 | Granneman | C23C 16/4411 117/104 |
| 8,592,810 B2 * | 11/2013 | Ohmi | H01L 21/0262 257/43 |
| 8,647,435 B1 * | 2/2014 | Dmitriev | H01L 21/02579 117/105 |
| 9,054,268 B2 * | 6/2015 | Hong | H01L 21/02557 |
| 2002/0028565 A1 * | 3/2002 | Nikolaev | B82Y 10/00 438/478 |
| 2009/0057132 A1 * | 3/2009 | Imanishi | C23C 14/022 204/192.1 |
| 2009/0289341 A1 * | 11/2009 | Yamazaki | G06K 19/07735 257/679 |
| 2010/0006836 A1 * | 1/2010 | Koukitu | C23C 16/0272 257/43 |
| 2010/0320462 A1 * | 12/2010 | Koukitu | C30B 25/02 257/49 |
| 2012/0064665 A1 * | 3/2012 | Yamazaki | H01L 21/02422 438/104 |
| 2013/0129923 A1 * | 5/2013 | Park | C23C 16/08 427/255.14 |
| 2013/0280859 A1 * | 10/2013 | Kim | H01L 29/7869 438/104 |
| 2014/0099443 A1 * | 4/2014 | Park | H01L 31/1884 427/250 |
| 2015/0125679 A1 * | 5/2015 | Ishikawa | C23C 16/402 428/216 |
| 2015/0225845 A1 * | 8/2015 | Park | C23C 16/48 427/551 |
| 2016/0108554 A1 * | 4/2016 | Koukitsu | H01L 21/02422 117/88 |

* cited by examiner

Upstream

RMS 0.128nm

Midstream

RMS 0.128nm

Downstream

RMS 0.122nm

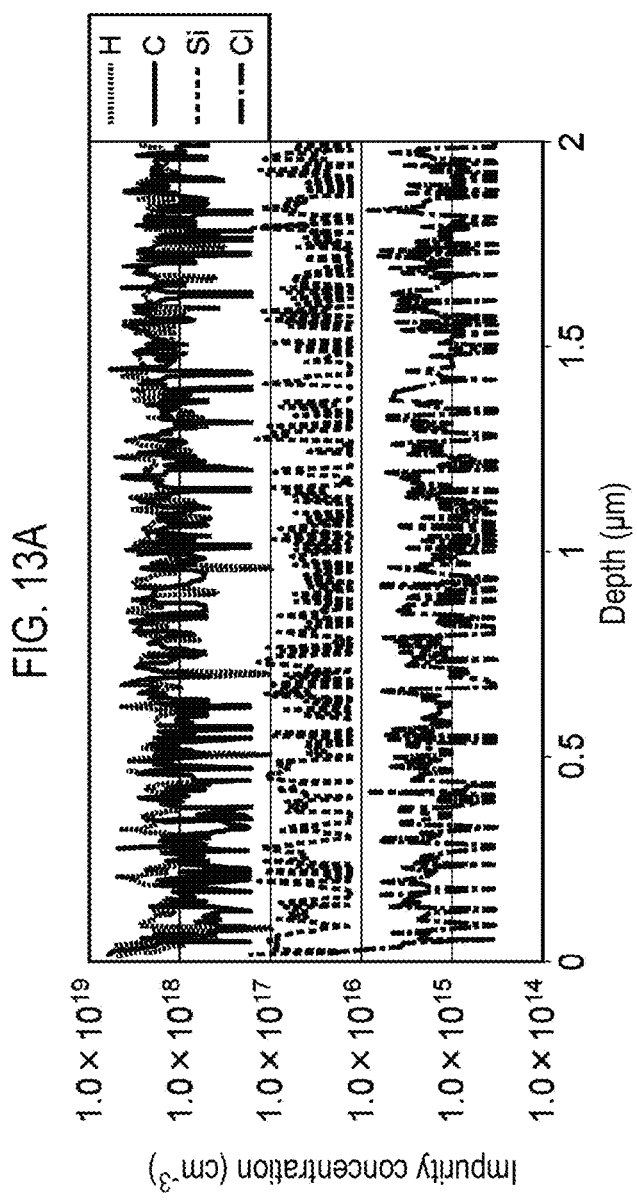

FIG. 22

| Temperature t3 (°C) | 800 | 900 | 1000 |
|---|---|---|---|
| RMS (nm) | 1.95 | 3.914 | 0.143 |
| FWHM (meV) | 86.9 | 86.9 | 86.5 |
| Deep/NBE | 0.06 | 0.09 | 0.08 |

| P(ZnCl$_2$) | 8.8E-05 | 2.2E-04 | 3.3E-04 |
|---|---|---|---|
| RMS (nm) | 0.137 | 0.143 | 0.124 |
| FWHM (meV) | 88.8 | 86.5 | 90.5 |
| Deep/NBE | 0.06 | 0.08 | 0.05 |

| Time (hour) | 1 | 6 | 9 |
|---|---|---|---|
| RMS (nm) | 0.143 | 0.226 | 1.912 |
| FWHM (meV) | 86.5 | 86.7 | 86 |
| Deep/NBE | 0.08 | 0.03 | 0.03 |

FIG. 23

| VI/II | 20 | 50 | 182 | 462 | 1200 | 2400 |
|---|---|---|---|---|---|---|
| RMS (nm) | | | 0.126 | 0.102 | 0.143 | 0.13 |
| FWHM (meV) | 89.1 | 88.3 | 87.2 | 88.4 | 86.5 | 88.2 |
| Deep/NBE | 0.06 | 0.12 | 0.21 | 0.11 | 0.08 | 0.09 |

0.2% Cl₂

10% Cl₂

ZNO FILM PRODUCTION SYSTEM AND PRODUCTION METHOD USING ZNO FILM PRODUCTION SYSTEM HAVING HEATING UNITS AND CONTROL DEVICE

This is a National Phase Application filed under 35 U.S.C. 371 as a national stage of PCT/JP2013/066863, filed Jun. 19, 2013; an application claiming the benefit to Japanese Application No. 2012-167481, filed Jul. 27, 2012; the content of each is hereby incorporated by reference in its entirety.

TECHNICAL FIELD

The present disclosure relates to a ZnO film production device and production method.

BACKGROUND

In the related art, it is known that a ZnO film is an element useful in various kinds of electronic devices such as a solar cell, a surface acoustic wave device, a resonator, a photoacoustic device, a light emitting diode, a laser diode, and the like. A production device and production method of such a ZnO film is described in, e.g., Patent Document 1. Patent Document 1 discloses a technique in which a ZnO film is caused to epitaxially grow on a substrate by using zinc iodide (ZnI) as a Zn raw material, heating the zinc iodide to 380 degrees C., supplying an oxygen gas onto the substrate and causing Zn and $O_2$ to react with each other. Also known is a similar technique disclosed in Patent Document 2.

PRIOR ART DOCUMENTS

Patent Documents

Patent Document 1: Japanese laid-open publication No. 2001-270799
Patent Document 2: Japanese laid-open publication No. 2008-243987

In conventional methods, however, the quality of the ZnO film is low and the FWHM (Full Width at Half Maximum) in the X-ray diffraction is 20 to 80 min. That is to say, the FWHM of the ZnO film is 1,200 arcsec at most. In view of this problem, the present disclosure provides some embodiments of a ZnO film production device and production method capable of producing a high-quality ZnO film.

SUMMARY

According to one embodiment of the present disclosure, there is provided a ZnO film production device, including: an installation base configured to support a substrate on which a ZnO film is to be formed; a reaction container configured to accommodate the installation base; a first raw material storing part configured to communicate with an interior of the reaction container and to store a solid raw material which contains Zn; a second raw material storing part configured to communicate with the interior of the reaction container and to store a solid raw material which contains Zn; heating units configured to heat the installation base, the first and the second raw material storing parts; a chlorine gas supply source configured to supply a chlorine gas to at least the first raw material storing part; an oxygen gas supply source configured to supply an oxygen gas into the reaction container; and a control device, wherein the control device is configured to control the heating units such that a temperature T1 of the first raw material storing part, a temperature T2 of the second raw material storing part and a temperature T3 of the installation base on which the substrate is disposed satisfy a relationship of T1<T2<T3 during formation of the ZnO film, the control device is configured to control a flow rate of the chlorine gas supplied from the chlorine gas supply source to the first raw material storing part, and the control device is configured to supply a flow rate of the oxygen gas supplied from the oxygen gas supply source into the reaction container.

In the aforementioned production device, there exist the first and second raw material storing parts in which the temperatures T1 and T2 during the formation of the ZnO film differ from each other. The chlorine gas is supplied to at least one of the first and the second raw material storing parts. Thus, $ZnCl_2$ is generated by the reaction between the Zn solid raw material and the chlorine gas ($Cl_2$). Zn is gasified by the heating. The gasified Zn reacts with the oxygen gas on the surface of the substrate. Since these two kinds of Zn-based materials ($ZnCl_2$ and Zn) react with oxygen, it becomes possible to produce a high-quality ZnO film. When a film growth reaction of $ZnCl_2+0.5O_2=ZnO+Cl_2$ occurs on the substrate, if Zn which becomes a gas is supplied to the reaction system, a reaction of $Zn+Cl_2=ZnCl_2$ is generated to thereby accelerate the film growth reaction. If this is not the case, an etching reaction is generated by $Cl_2$, hindering the film growth reaction. The present inventors have found that, using this principle, a high-quality ZnO film can be produced by supplying Zn as a gas from a position which differs from the supply position of $ZnCl_2$.

Further, the aforementioned device includes: a carrier gas supply source configured to supply a carrier gas to the second raw material storing part, wherein the first and the second raw material storing parts are configured to independently control flow rates of gases injected therefrom and are disposed in a spaced-apart relationship such that an injection direction of a gas injected from the first raw material storing part differs from an injection direction of a gas injected from the second raw material storing part.

If Zn is gasified, the carrier gas supply source can transport the gasified Zn toward the substrate. The carrier gas supply source may contain a chlorine gas.

Further, the aforementioned device is configured so that the first and the second raw material storing parts are arranged adjacent to one another such that a gas passing through the first raw material storing part passes through the second raw material storing part.

In this case, similarly, $ZnCl_2$ is generated by the reaction between the Zn solid raw material and the chlorine gas ($Cl_2$). Zn is gasified by the heating. The gasified Zn reacts with an oxygen gas on the surface of the substrate. Since these two kinds of Zn-based materials ($ZnCl_2$ and Zn) react with oxygen, it becomes possible to produce a high-quality ZnO film. As described above, when a film growth reaction of $ZnCl_2+0.5O_2=ZnO+Cl_2$ occurs on the substrate, if Zn which becomes a gas is supplied to the reaction system, a reaction of $Zn+Cl_2=ZnCl_2$ is generated to thereby accelerate the film growth reaction. If this is not the case, an etching reaction is generated by $Cl_2$, hindering the film growth reaction. While Zn as a gas is supplied from a position which differs from the supply position of $ZnCl_2$, there is no reason to prevent both gases from passing through the same route. Thus, the present inventors have confirmed that a high-quality ZnO film can be produced using this principle.

Further, the aforementioned control device controls an amount of the chlorine gas supplied from the chlorine gas supply source and sets a partial pressure of a zinc chloride gas to become $8.8 \times 10^{-5}$ atm or more and $3.6 \times 10^{-4}$ atm or less in a near-field region just above a surface of the substrate. This is because, if the partial pressure of the zinc chloride gas is equal to or higher than the lower limit, the ZnO film grows. In addition, if the partial pressure of the zinc chloride gas exceeds the upper limit, the ZnO film begins to be etched and does not grow. The near-field region is defined as a region which exists within 1 cm from the substrate surface in a direction perpendicular to the substrate surface.

Further, the aforementioned control device controls an amount of the chlorine gas supplied from the chlorine gas supply source and sets a partial pressure of a zinc chloride gas to become $8.8 \times 10^{-5}$ atm or more and $3.3 \times 10^{-4}$ atm or less in a near-field region just above a surface of the substrate. This is because, if the partial pressure of the chlorine gas falls within the aforementioned range, the ZnO film sufficiently grows.

Further, the aforementioned control device controls an amount of the chlorine gas supplied from the chlorine gas supply source and sets a partial pressure of a zinc chloride gas to become $8.8 \times 10^{-5}$ atm or more and $2.2 \times 10^{-4}$ atm or less in a near-field region just above a surface of the substrate. This is because, if the partial pressure of the chlorine gas falls within the aforementioned range, the growth rate of the ZnO film becomes constant and stably controllable.

Further, the first and the second raw material storing parts are arranged adjacent to one another such that a gas passing through the first raw material storing part passes through the second raw material storing part, and the first and the second raw material storing parts have a bottom surface inclined such that the depth from a horizontal surface positioned above the bottom surface grows larger toward a gas injection port of the second raw material storing part.

In this case, the Zn-containing solid raw materials come close to the gas injection port along the bottom surface under the action of gravity. Accordingly, even if the amount of the solid raw materials varies, it is possible to dispose the solid raw materials with high reproducibility. This makes it possible to suppress fluctuation of the positions of the solid raw materials and to stabilize the quality of the ZnO film.

Further, a ZnO film production method for producing a ZnO film using the aforementioned ZnO film production device, including: disposing the substrate on the installation base; and, while supplying the chlorine gas from the chlorine gas supply source to the first raw material storing part and supplying the oxygen gas from the oxygen gas supply source into the reaction container, controlling the heating units with the control device such that the temperature T1 of the first raw material storing part, the temperature T2 of the second raw material storing part and the temperature of the installation base on which the substrate is disposed satisfy a relationship of $T1<T2<T3$.

According to the production method, as described above, it is possible to produce a high-quality ZnO film.

According to another embodiment of the present disclosure, there is provided a ZnO film production device, including: an installation base configured to support a substrate on which a ZnO film is to be formed; a reaction container configured to accommodate the installation base; a first raw material storing part configured to communicate with an interior of the reaction container and to store a solid raw material which contains Zn; a second raw material storing part configured to communicate with the interior of the reaction container and to store a solid raw material which contains Zn; heating units configured to heat the first and the second raw material storing parts; a first gas supply source configured to supply a chlorine-containing gas to at least the first raw material storing part; and a second gas supply source configured to supply an oxygen-containing gas into the reaction container, wherein a temperature T1 of the first raw material storing part and a temperature T2 of the second raw material storing part satisfy a relationship of $T1<T2$ during formation of the ZnO film. In this case, as described above, it is possible to produce a high-quality ZnO film.

According to the production device and production method of the present disclosure, it is possible to produce a high-quality ZnO film.

BRIEF DESCRIPTION OF THE DRAWINGS

FIGS. 13A and 13B are graphs representing the relationship between the depth ($\mu$m) in the ZnO film and the impurity concentration ($cm^{-3}$).

FIGS. 22 and 23 are tables showing the characteristics of the ZnO film for each of various conditions.

DETAILED DESCRIPTION

A ZnO film production device and production method according to an embodiment will now be described in detail with reference to the accompanying drawings. Identical elements will be designated by like reference symbols with no duplicate description made thereon.

Figure 1:
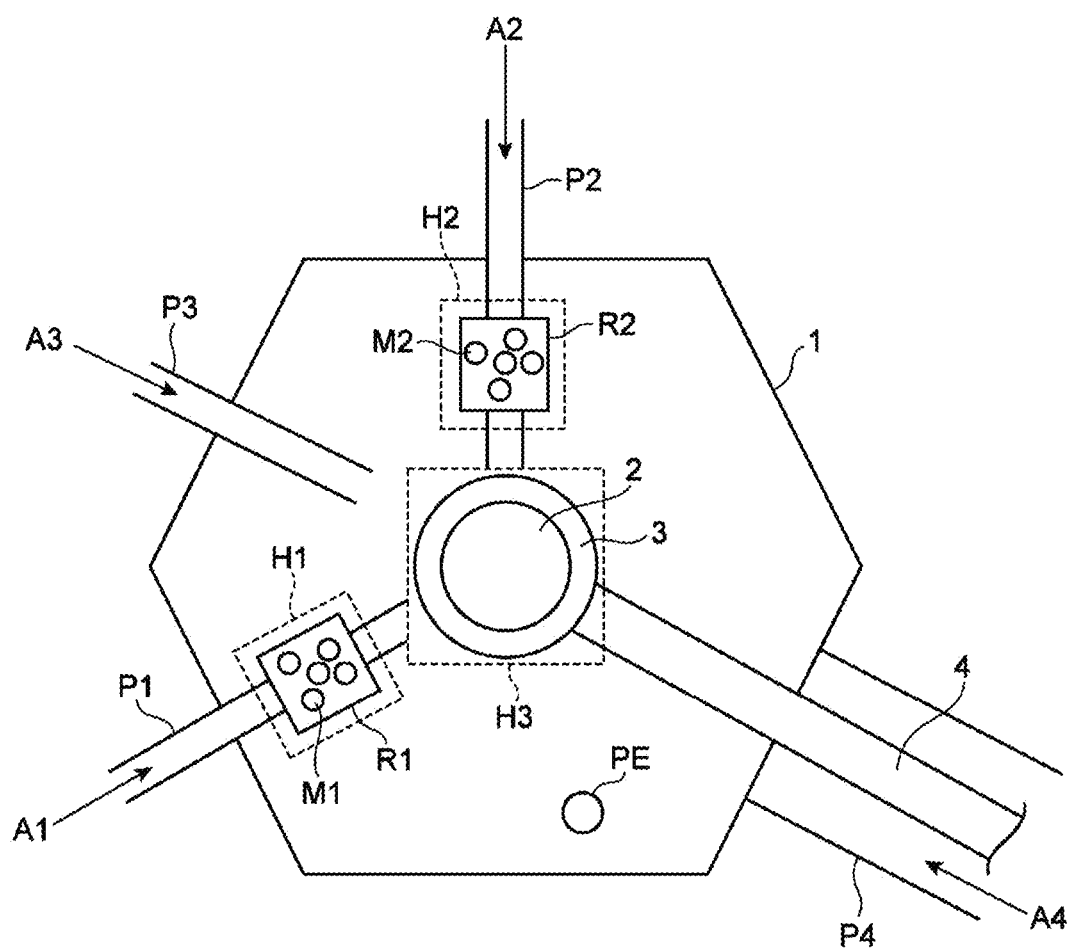
FIG. 1 is a plan view of a first ZnO film production device.

FIG. 1 is a plan view of a first ZnO film production device.

This ZnO film production device includes an installation base 3 configured to support a substrate (wafer) 2 on which a ZnO is to be formed and a reaction container 1 configured to accommodate the installation base 3. In this example, a first raw material storing part (room) R1 and a second raw material storing part (room) R2 are disposed within the reaction container 1. Alternatively, the first and the second raw material storing parts R1 and R2 may be disposed outside the reaction container 1. At least the first raw material storing part R1 communicates with the interior of the reaction container 1 and stores a solid raw material M1 which contains Zn. Similarly, the second raw material storing part R2 communicates with the interior of the reaction container 1 and stores a solid raw material M2 which contains Zn. The substrate 2 used herein is a ZnO substrate being 1 cm in diameter or 1 cm×1 cm in size and manufactured by a hydrothermal synthesis method.

The production device further includes heating units H1, H2 and H3 configured to heat the installation base 3, and the first and the second raw material storing parts R1 and R2. The heating units include heaters H1, H2 and H3 for heating the respective elements. Known heaters such as a resistance heater, a lamp heater, a high-frequency heater, and so forth may be used. In is example, a heating furnace using a resistance heater is employed. Upon supplying a current thereto, the heaters H1, H2 and H3 heat the first raw material storing part R1, the second raw material storing part R2 and the installation base 3, respectively.

The solid raw material M1 which contains Zn is metal Zn in this example. The solid raw material may contain impurities at such a level as not to largely affect the result. The reaction container 1 is used at a normal pressure (1 atmosphere (atm)) but may be used under a depressurized environment. A first gas (a chlorine gas or the like) A1 and a second gas (a carrier gas or the like) A2 can be introduced into the reaction container 1 along arrow directions through the first raw material storing part R1 kept at a relatively low temperature and the second raw material storing part R2 kept at a relatively high temperature, respectively.

The first gas A1 is introduced into the first raw material storing part R1 through a first supply pipe P1. The first gas A1 reacts with the solid raw material M1 within the first raw material storing part R1 and then flows toward the substrate 2 disposed within the reaction container 1. The second gas A2 is introduced into the second raw material storing part R2 through a second supply pipe P2. The second gas A2 reacts with the solid raw material M2 within the second raw material storing part R2 and then flows toward the substrate 2 disposed within the reaction container 1.

Furthermore, a third gas A3 and a fourth gas A4 flow into the reaction container 1 through a third supply pipe P3 and a fourth supply pipe P4, respectively, and flow toward the substrate 2. An exhaust device (which will be described later) is connected to the reaction container 1. The gas existing within the reaction container 1 is discharged to the outside through an exhaust pipe PE.

The installation base 3 is conveyed into the reaction container 1 by a conveyance arm (rod) 4 having a tip portion to which the installation base 3 is fixed. Needless to say, the installation base 3 may be fixed within the reaction container 1. The conveyance arm 4 may convey the substrate 2 onto the installation base 3 and then may retract outside of the reaction container 1. If necessary, a load lock chamber configured to carry the substrate between the reaction container 1 and the outside or a processing apparatus (a film forming apparatus such as a sputtering apparatus or the like, an etching apparatus, or the like) configured to perform the processing of other materials may be installed in the reaction container 1.

Figure 2:
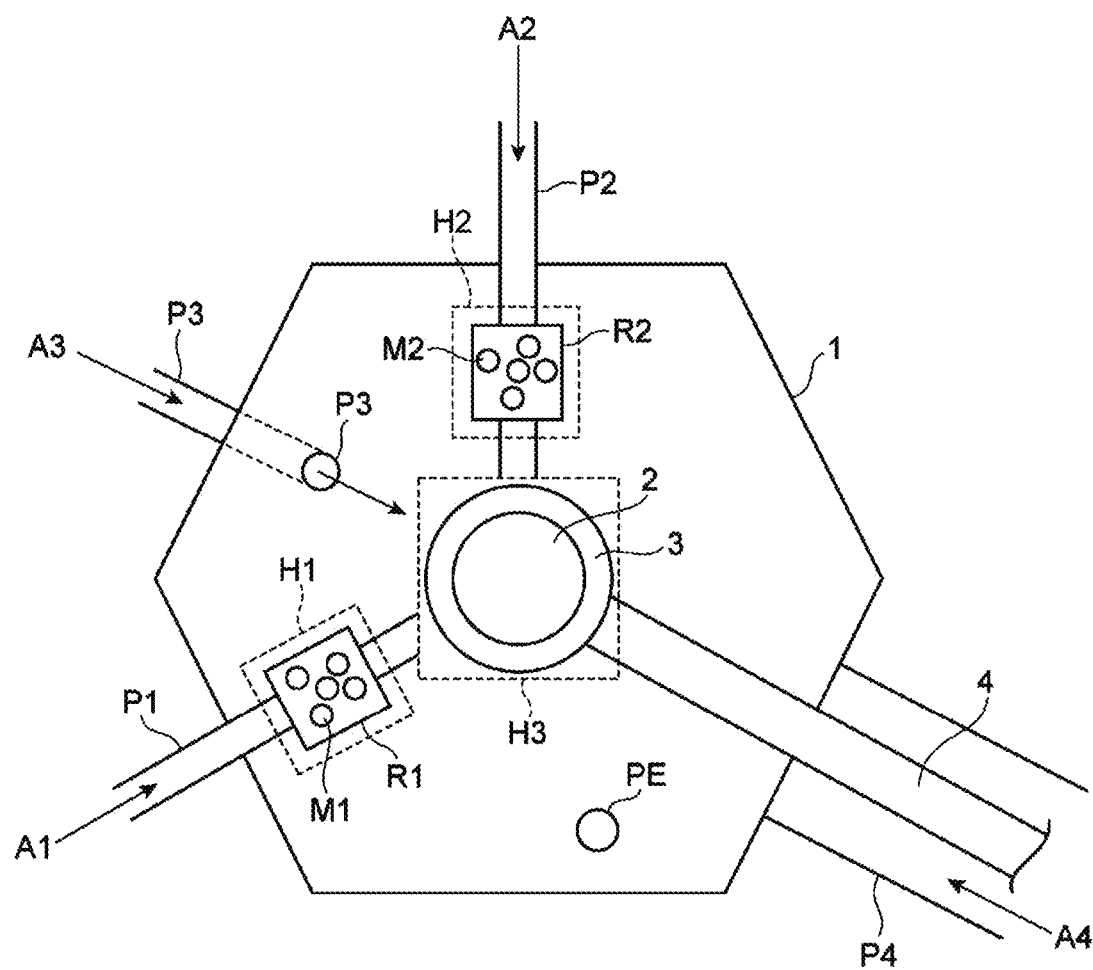
FIG. 2 is a plan view of a production device which is a modification of the first ZnO film production device.

FIG. 2 is a plan view of a production device which is a modification of the first ZnO film production device.

In the production device shown in FIG. 1, the third supply pipe P3 is connected to the side surface of the reaction container 1 so as to extend in the horizontal direction. In this example, however, the third supply pipe P3 is connected to the bottom surface of the reaction container 1 so as to extend in the vertical direction. The third supply pipe P3 may extend from the reaction container 1 in the vertical direction and then may extend in the horizontal direction. Moreover, the connection position of the remaining supply pipes may be changed to the side surface, the bottom surface or the top surface of the reaction container 1.

Figure 3:
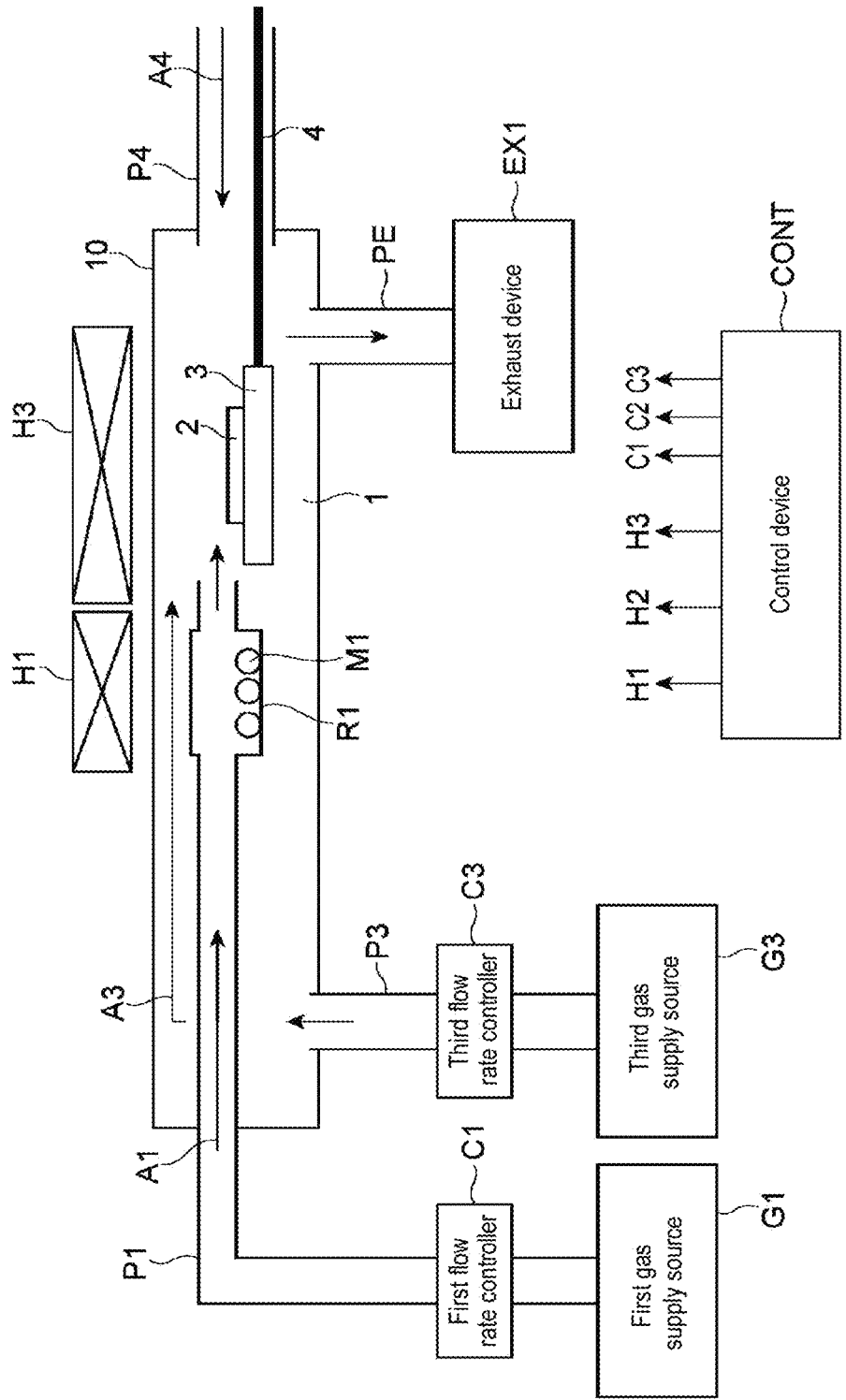
FIG. 3 is a view showing a vertical cross-sectional configuration along a first gas supply pipe P1 of the production device shown in FIG. 2.

FIG. 3 is a view showing a vertical cross-sectional configuration along the first supply pipe P1 of the production device shown in FIG. 2.

A first gas supply source G1 is connected to the first supply pipe P1 through a first flow rate controller C1. The first supply pipe P1 is connected to the first raw material storing part R1. A gas injection port of the first raw material storing part R1 faces toward the substrate 2.

A third gas supply source G3 is connected to the third supply pipe P3 through a third flow rate controller C3. The third supply pipe P3 communicates with the interior of the reaction container 1. The third gas A3 thus introduced flows toward the substrate 2. In addition, the fourth gas A4 is introduced into the reaction container 1 from a carrier gas supply source not shown. The fourth gas A4 flows toward the substrate 2.

Figure 4:
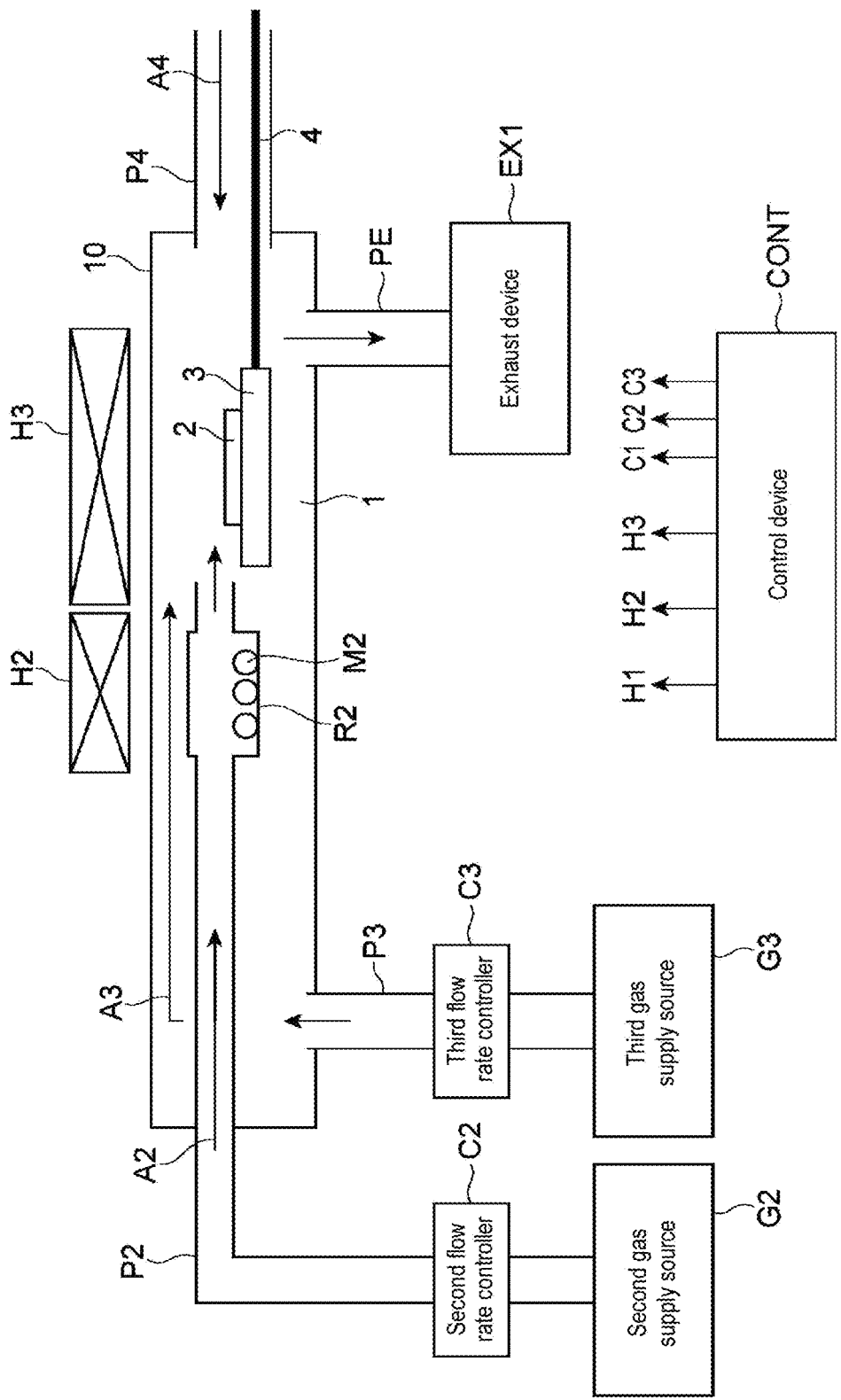
FIG. 4 is a view showing a vertical cross-sectional configuration along a second gas supply pipe P2 of the production device shown in FIG. 2.

FIG. 4 is a view showing a vertical cross-sectional configuration along the second supply pipe P2 of the production device shown in FIG. 2.

A second gas supply source G2 is connected to the second supply pipe P2 through a second flow rate controller C2. The second supply pipe P2 is connected to the second raw material storing part R2. A gas injection port of the second raw material storing part R2 faces toward the substrate 2. The gas introduced into the reaction container 1 is discharged through the exhaust pipe PE by an exhaust device EX1.

A control device CONT shown in FIGS. 3 and 4 controls the heating units H1, H2 and H3 such that, during the formation of the ZnO film, the temperature T1 of the first raw material storing part R1, the temperature T2 of the second raw material storing part R2 and the temperature T3 of the installation base 3 on which the substrate 2 is disposed satisfy a relationship of T1<T2<T3. Furthermore, when forming the ZnO film, the control device CONT controls a flow rate of a chlorine gas supplied from the first gas supply source (chlorine gas supply source) G1 into the first raw material storing part R1 and a flow rate of an oxygen gas supplied from the third gas supply source (oxygen gas supply source) G3 into the reaction container 1. The control device CONT controls the heaters H1, H2 and H3 and the flow rate controllers C1, C2 and C3.

Furthermore, the second gas supply source G2 is a carrier gas supply source which supplies a carrier gas ($N_2$) to the second raw material storing part R2. In the present production device, the first and the second raw material storing parts R1 and R2 can independently control the flow rates of the gases injected therefrom. Moreover, the first and the second raw material storing parts R1 and R2 are disposed in a spaced-apart relationship, such that the injection directions of the gases injected from the first and the second raw material storing parts R1 and R2 differ from each other.

In this regard, if Zn is gasified (sublimated), the carrier gas injected from the second gas supply source G2 (carrier gas supply source) can transport the gasified Zn toward the substrate 2. The carrier gas supply source may contain a chlorine gas. That is to say, the chlorine gas is supplied from the chlorine gas supply source to at least the first raw material storing part R1. It may also be possible to supply the chlorine gas to the second raw material storing part R2.

Specifically, the first gas A1, the second gas A2, the third gas A3 and the fourth gas A4 are as follows. The first gas A1 includes a chlorine gas and a nitrogen gas. The second gas A2 includes a nitrogen gas but may include a chlorine gas. The third gas A3 is an oxygen gas but may include a nitrogen gas. The fourth gas A4 is a nitrogen gas. Instead of the nitrogen gas as the carrier gas, it may be possible to use an inert gas such as argon or the like.

Figure 5:
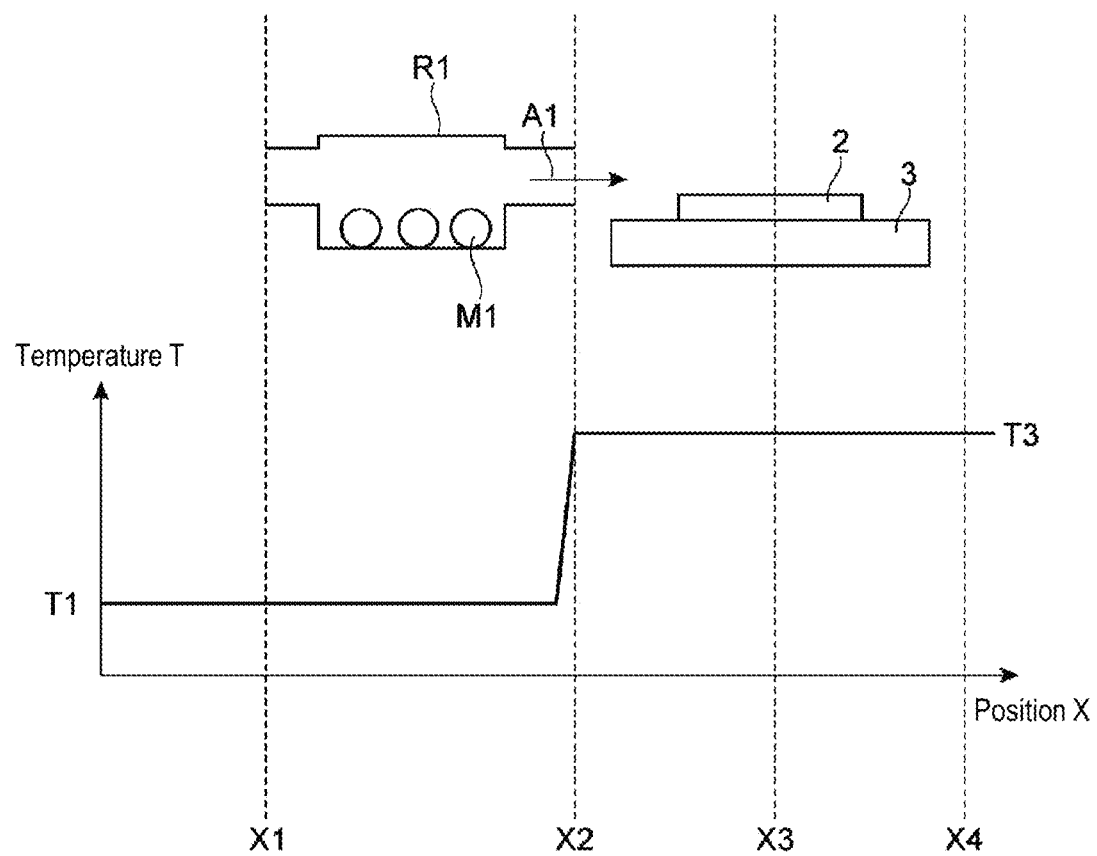
FIG. 5 is a view showing a first raw material storing part and a substrate, together with a graph which represents the relationship between the positions of the first raw material storing part and the substrate and the temperature.

FIG. 5 is a view showing the first raw material storing part and the substrate, together with a graph which represents the relationship between the positions of the first raw material storing part and the substrate and the temperature.

The radial positions X within the reaction container 1 are defined as X1, X2, X3 and X4 in the named order from the upstream side of the gas flow. In the first raw material storing part R1, the position X1 refers to the position of a gas introduction port of the first raw material storing part R1. The position X2 refers to the position of a gas injection port of the first raw material storing part R1. The position X3 refers to the position of a center of gravity of the substrate 2. The position X4 refers to the position opposite to the position X2 from the position of the center of gravity X3.

In a region (extending from X1 to X2) which covers the first raw material storing part R1, the temperature of a region where a solid raw material M1 is disposed is kept at a constant temperature (at a low temperature) T1. In a region (extending from X2 to X4) which covers the installation base 3 and the substrate 2, the temperature is kept at a constant temperature (at a high temperature) T3.

Figure 6:
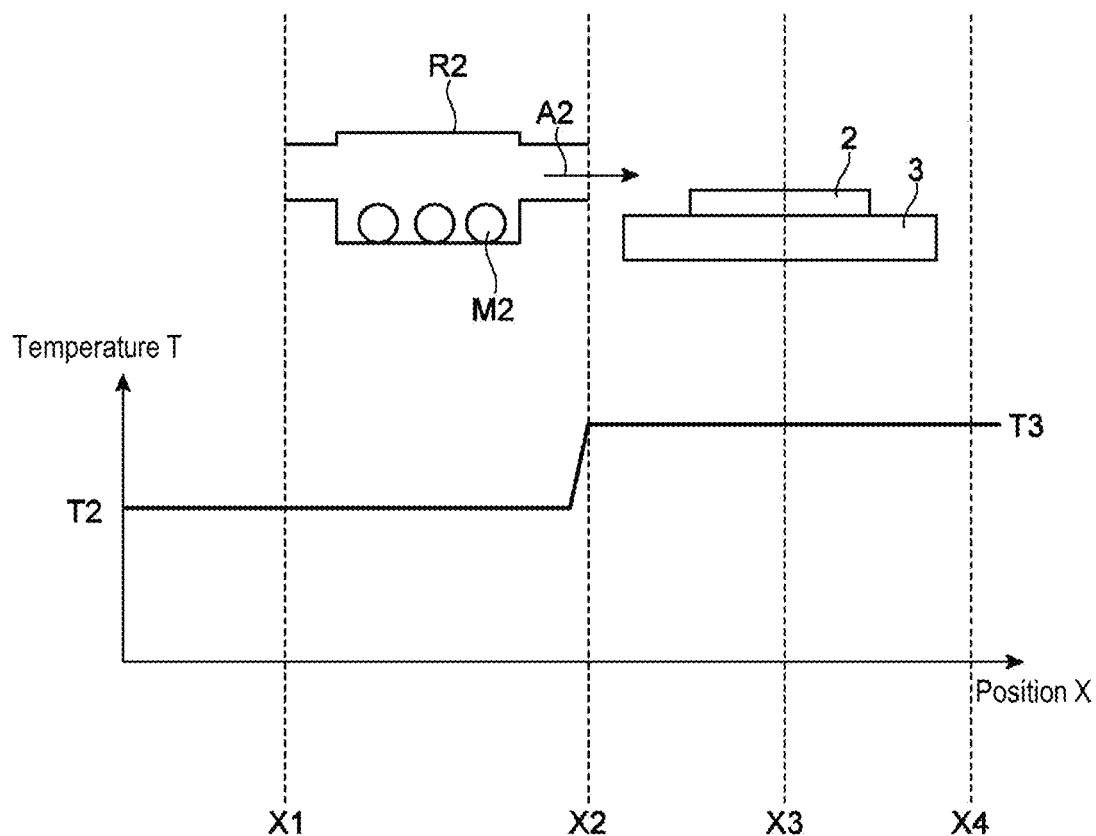
FIG. 6 is a view showing a second raw material storing part and a substrate, together with a graph which represents the relationship between the positions of the second raw material storing part and the substrate and the temperature.

FIG. 6 is a view showing the second raw material storing part and the substrate, together with a graph which represents the relationship between the positions of the second raw material storing part and the substrate and the temperature.

In the second raw material storing part R2, the position X1 refers to the position of a gas introduction port of the second raw material storing part R2. The position X2 refers to the position of a gas injection port of the second raw material storing part R2. The position X3 refers to the position of a center of gravity of the substrate 2. The position X4 refers to the position opposite to the position X2 from the position of the center of gravity X3.

In a region (extending from X1 to X2) which covers the second raw material storing part R2, the temperature of a region where a solid raw material M2 is disposed is kept at a constant temperature (at an intermediate temperature) T2. In a region (extending from X2 to X4) which covers the installation base 3 and the substrate 2, the temperature is kept at a constant temperature (at a high temperature) T3.

According to the production device, there exist the first and second raw material storing parts R1 and R2 in which the temperatures T1 and T2 during the formation of the ZnO film differ from each other. The chlorine gas is supplied to at least the first raw material storing part R1. Thus, $ZnCl_2$ is generated by the reaction between the Zn solid raw material M1 (M2) and the chlorine gas $Cl_2$. Zn is gasified by the heating. The gasified Zn reacts with an oxygen gas on the surface of the substrate 2. The temperature T1 is a temperature required for generating $ZnCl_2$. The temperature T2 is a temperature required for gasifying (sublimating) Zn. Since these two kinds of Zn-based materials ($ZnCl_2$ and Zn) react with oxygen, it becomes possible to produce a high-quality ZnO film. More specifically, when a film growth reaction of $ZnCl_2+0.5O_2=ZnO+Cl_2$ occurs on the substrate, if Zn which becomes a gas is supplied to the reaction system, a reaction of $Zn+Cl_2=ZnCl_2$ is generated. Thus, this reaction accelerates the film growth reaction. If this is not the case, an etching reaction is generated by $Cl_2$, hindering the film growth reaction. Using this principle, a high-quality ZnO film can be produced by supplying Zn as a gas from a position which differs from the supply position of $ZnCl_2$.

The settable ranges of the temperatures T1, T2 and T3 are as follows.

200 degrees C.≤T1≤420 degrees C.

300 degrees C.≤T2≤600 degrees C.

600 degrees C.≤T3≤1000 degrees C.

In the raw material storing parts R1 and R2, the following two kinds of reactions occur. (s) is a solid body and (g) is a gas. $P^0$ denotes an initial partial pressure.

$$Zn(s)+Cl_2(g) \rightarrow ZnCl_2(g) \quad (1)$$

$$Zn(s) \rightarrow Zn(g) \quad (2)$$

The following reactions occur on the substrate surface.

$$ZnCl_2(g)+0.5O_2(g) \rightarrow ZnO(s)+Cl_2(g) \quad (3)$$

$$Zn(g)+0.5O_2(g) \rightarrow ZnO(s) \quad (4)$$

The pressures P of the respective gases have the following relationships.

$$P(Cl_2)+P(ZnCl_2)+P(Zn)+P(O_2)+P(N_2)=1 \quad (5)$$

$$P^0(ZnCl_2)-P(ZnCl_2)-P(Zn)=2P^0(O_2)-2P^0(O_2) \quad (6)$$

$$P^0(ZnCl_2)=P(ZnCl_2)+P(Cl_2) \qquad (7)$$

Figure 7:
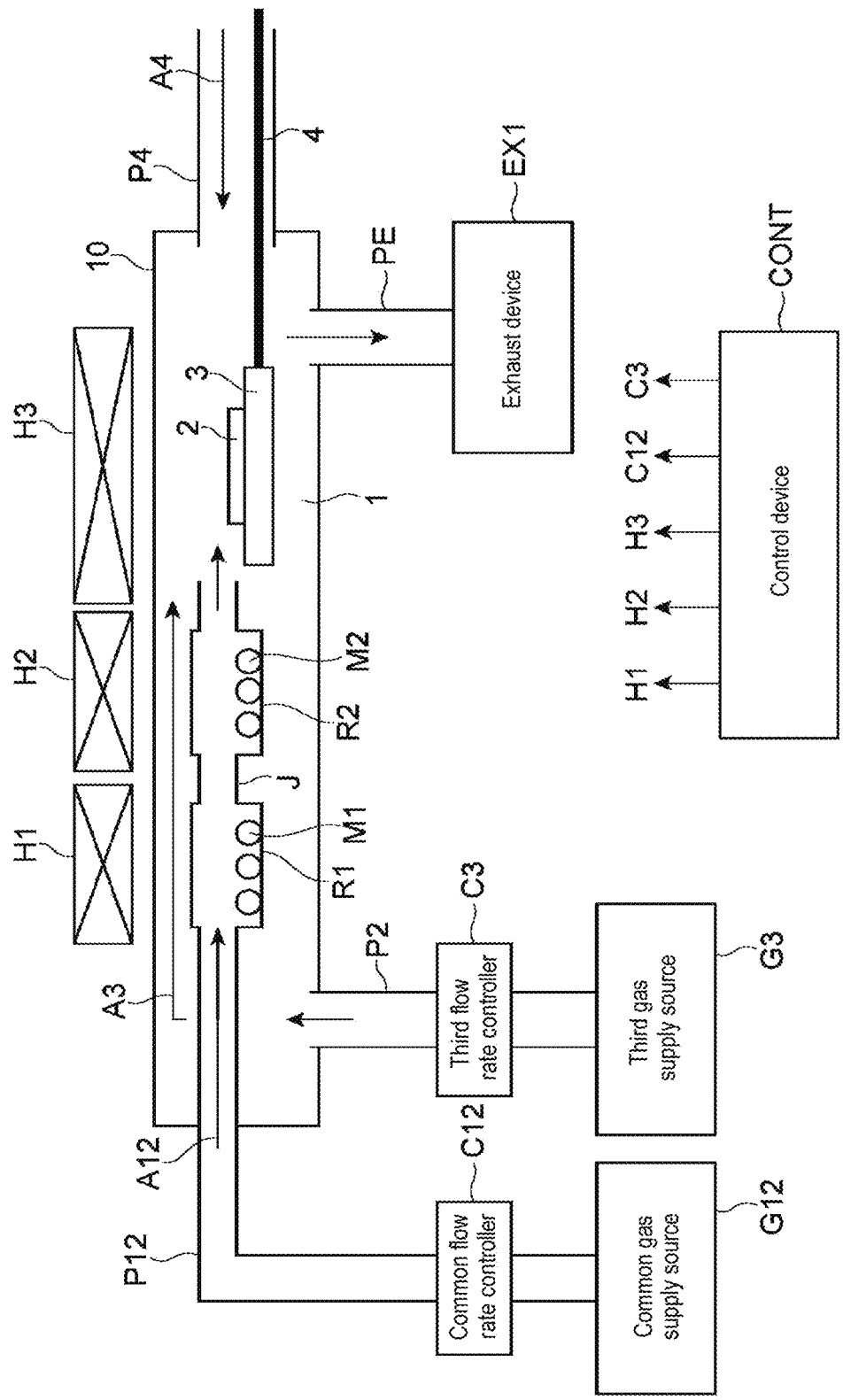
FIG. 7 is a view showing a vertical cross-sectional configuration of a second ZnO film production device.

FIG. 7 is a view showing a vertical cross-sectional configuration of a second ZnO film production device.

The second ZnO film production device differs from the first ZnO film production device shown in FIGS. 2 to 4. This is because the first and the second raw material storing parts R1 and R2 are arranged adjacent to one another so that the gas passing through the first raw material storing part R1 can pass through the second raw material storing part R2. Other points remain the same. In FIG. 7, the first and the second raw material storing parts R1 and R2 are connected to each other by a connection pipe J. Furthermore, the first and second gas supply sources used in the first ZnO film production device are replaced by a common gas supply source G12. The common gas supply source G12 is connected to a supply pipe P12 through a common flow rate controller C12. The supply pipe P12 is connected to the first raw material storing part R1. The first raw material storing part R1 is connected to the second raw material storing part R2 through the connection pipe J.

A common gas A12 as a mixed gas of a chlorine gas and a nitrogen gas is supplied from the common gas supply source G12. The common gas A12 (chlorine gas) reacts with the solid raw material M1 of the first raw material storing part R1. Subsequently, the common gas A12 makes contact with the solid raw material M2 of the second raw material storing part R2 and moves from the injection port of the second raw material storing part R2 toward the substrate 2. The respective raw material storing parts R1 and R2 are heated by the heaters H1 and H2. The substrate 2 and the installation base 3 are heated by the heater H3.

A control device CONT shown in FIG. 7 controls the heating units H1, H2 and H3 such that, during the formation of the ZnO film, the temperature T1 of the first raw material storing part R1, the temperature T2 of the second raw material storing part R2 and the temperature T3 of the installation base 3 on which the substrate 2 is disposed satisfy a relationship of T1<T2<T3. Furthermore, when forming the ZnO film, the control device CONT controls a flow rate of a chlorine gas supplied from the common gas supply source (chlorine gas supply source) G12 into the first and second raw material storing parts R1 and R2 and a flow rate of an oxygen gas supplied from the third gas supply source (oxygen gas supply source) G3 into the reaction container 1. The control device CONT controls the heaters H1, H2 and H3 and the flow rate controllers C12 and C3.

In this production device, just like the aforementioned device, $ZnCl_2$ is generated by the reaction between the Zn solid raw material and the chlorine gas ($Cl_2$). Zn is gasified (sublimated) by the heating. The gasified Zn reacts with an oxygen gas on the surface of the substrate. Since these two kinds of Zn-based materials ($ZnCl_2$ and Zn) react with oxygen, it becomes possible to produce a high-quality ZnO film. The temperature T1 is a temperature required for generating $ZnCl_2$. The temperature T2 is a temperature required for gasifying (sublimating) Zn. As described above, when a film growth reaction of $ZnCl_2+0.5O_2=ZnO+Cl_2$ occurs on the substrate, if Zn which becomes a gas is supplied to the reaction system, a reaction of $Zn+Cl_2=ZnCl_2$ is generated. Thus, this reaction accelerates the film growth reaction. If this is not the case, an etching reaction is generated by $Cl_2$, hindering the film growth reaction. While Zn as a gas is supplied from a position which differs from the supply position of $ZnCl_2$, there is no reason to prevent both gases from passing through the same route. It was confirmed that a high-quality ZnO film can be produced.

Figure 8:
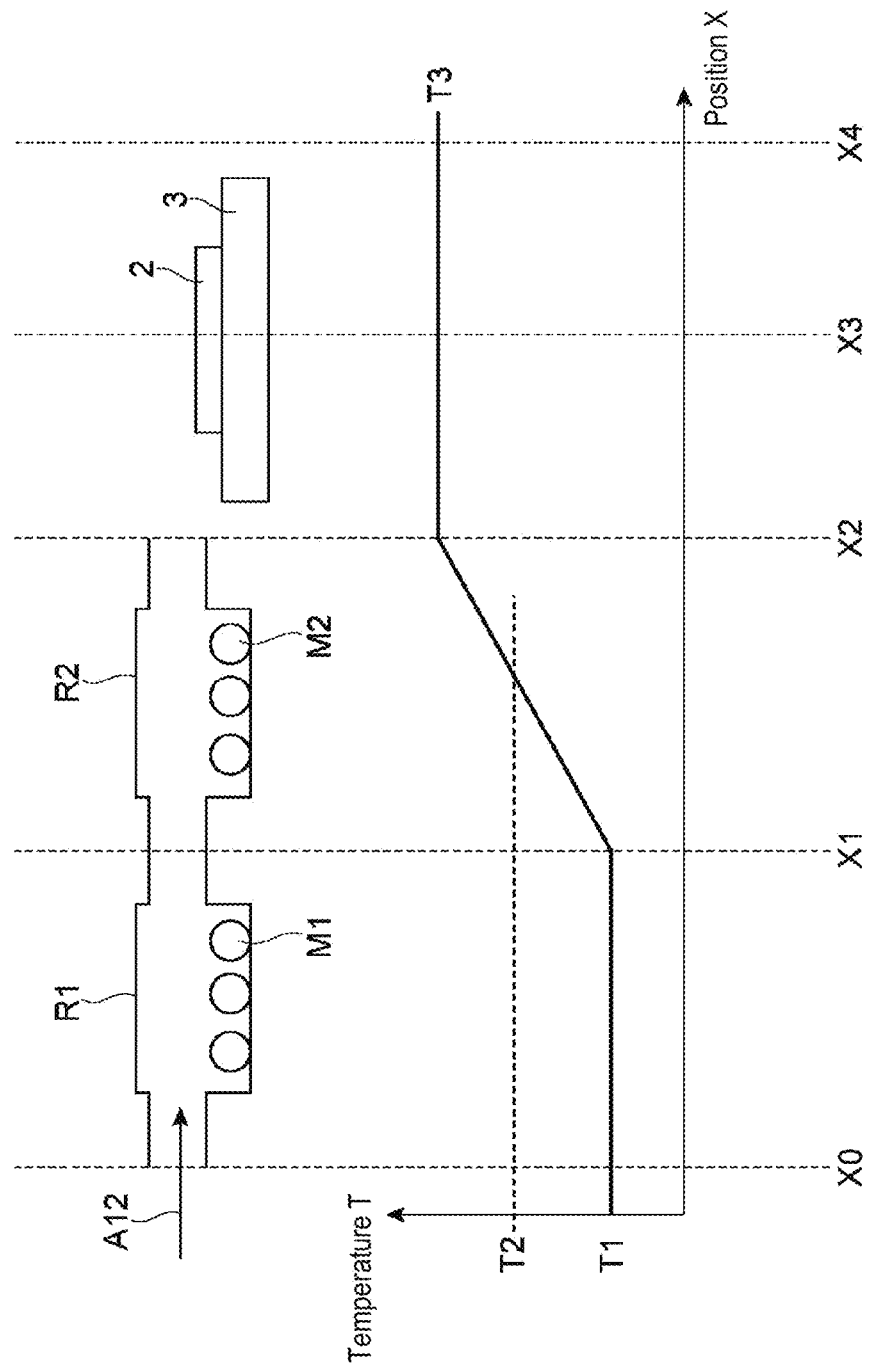
FIG. 8 is a view showing first and second raw material storing parts and a substrate, together with a graph which represents the relationship between the positions of the first and second raw material storing parts and the substrate and the temperature.

FIG. 8 is a view showing the first and second raw material storing parts and the substrate, together with a graph which represents the relationship between the positions of the first and second raw material storing parts and the substrate and the temperature.

The radial positions X within the reaction container 1 are defined as X0, X1, X2, X3 and X4 in the named order from the upstream side of the gas flow. The position X0 refers to the position of a gas introduction port of the first raw material storing part R1. The position X1 refers to the position of a gas injection port of the first raw material storing part R1. The position X2 refers to the position of a gas injection port of the second raw material storing part R2. The position X3 refers to the position of a center of gravity of the substrate 2. The position X4 refers to the position opposite to the position X2 from the center of gravity position X3.

In a region (extending from X0 to X1) which covers the first raw material storing part R1, the temperature of a region where a solid raw material M1 is disposed is kept at a constant temperature (at a low temperature) T1. In a region (extending from X1 to X2) which covers the second raw material storing part R2, the temperature of a region where a solid raw material M2 is disposed grows higher toward the substrate. That is to say, in the region (extending from X1 to X2), there is a temperature gradient. The average value of the in-plane temperature is an intermediate temperature T2. In a region (extending from X2 to X4) which covers the installation base 3 and the substrate 2, the temperature of the region is kept at a constant temperature (at a high temperature) T3. Whatever the case may be, a relationship of T1<T2<T3 is satisfied. The temperatures T1 and T2 are average values of the temperatures of the respective regions where the respective solid raw materials M1 and M2 are disposed. In addition, the temperature T3 is an in-plane average value of the substrate temperature.

Figure 9:
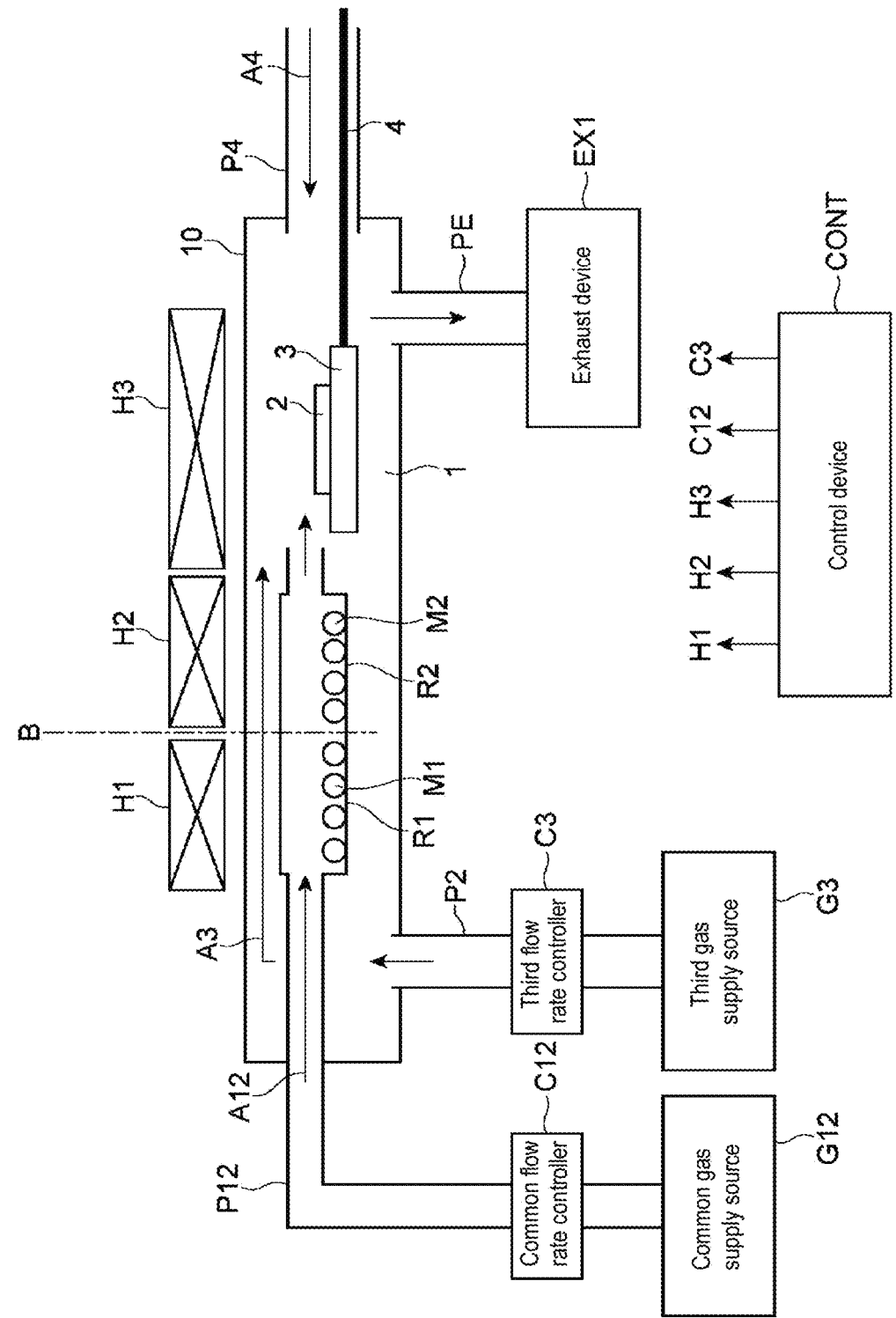
FIG. 9 is a view showing a vertical cross-sectional configuration of a production device which is a modification of the second ZnO film production device.

FIG. 9 is a view showing a vertical cross-sectional configuration of a production device which is a modification of the second ZnO film production device.

This production device differs from the production device shown in FIG. 7 in that the connection pipe J is removed and the bottom surfaces of the first and the second raw material storing parts R1 and R2 are arranged adjacent to one another in a flat shape. In this case, a longitudinal midpoint position of the overall raw material storing part may be a boundary position B of the first and second raw material storing parts R1 and R2. Other configurations remain the same as those shown in FIGS. 7 and 9.

Figure 10:
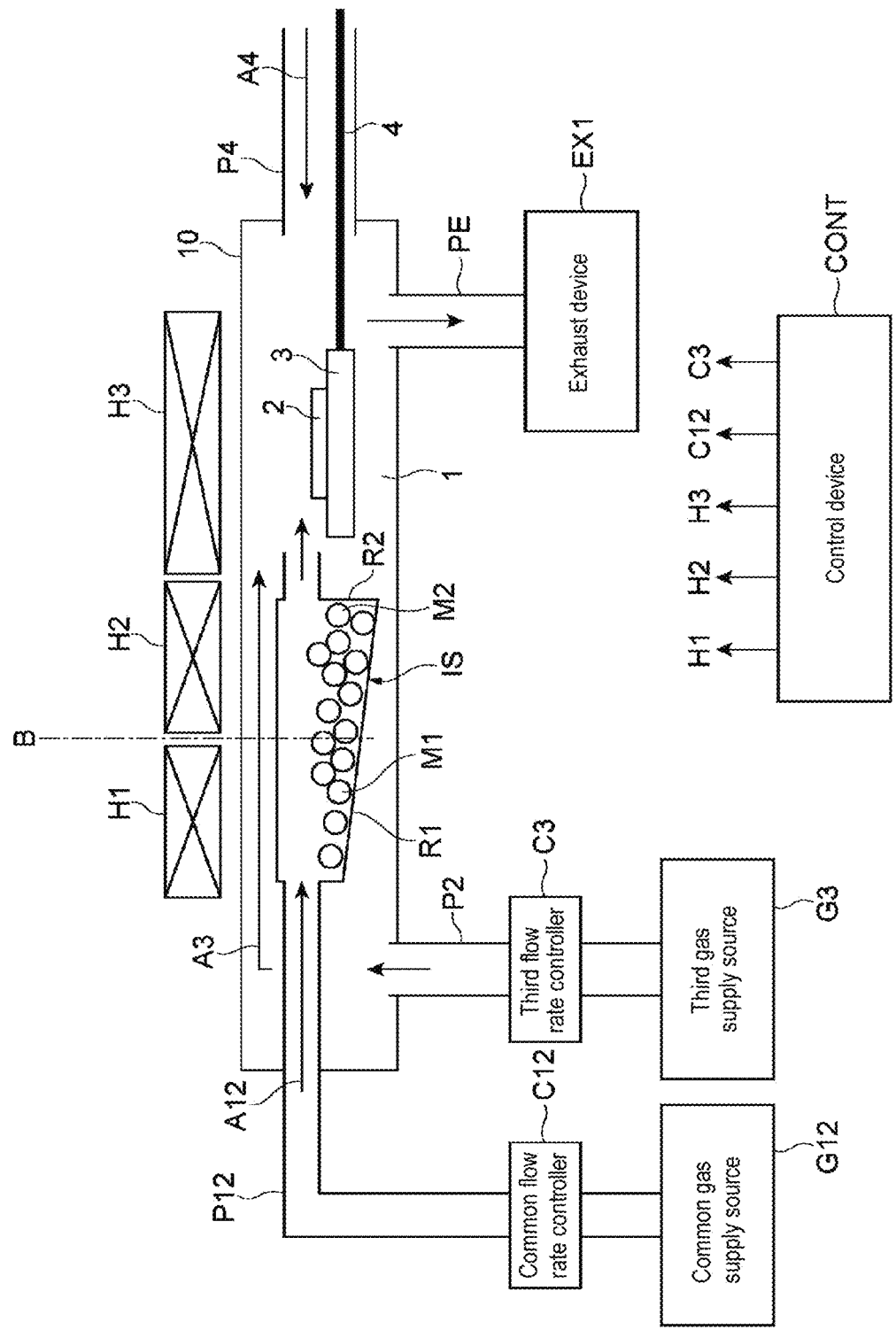
FIG. 10 is a view showing a vertical cross-sectional configuration of a production device which is a modification of the ZnO film production device shown in FIG. 9.

FIG. 10 is a view showing a vertical cross-sectional configuration of a production device which is a modification of the ZnO film production device shown in FIG. 9.

This production device is identical with the production device shown in FIG. 9 in that the first and the second raw material storing parts R1 and R2 are arranged adjacent to one another so that the gas passing through the first raw material storing part R1 can pass through the second raw material storing part R2. In this example, the bottom surface IS of the first and second raw material storing parts R1 and R2 is inclined such that the depth from the horizontal surface (e.g., the horizontal surface parallel to the axis of the supply pipe P12) positioned above the bottom surface grows larger toward the gas injection port of the second raw material storing part R2. Other points remain the same as those of the production device shown in FIG. 9.

In this case, the Zn-containing solid raw materials M1 and M2 come close to the gas injection port along the bottom surface IS due to gravity. Accordingly, even if the amount of the solid raw materials M1 and M2 varies, it is possible to dispose the solid raw materials M1 and M2 with high reproducibility. This makes it possible to suppress fluctuation of the positions of the solid raw materials and to stabilize the quality of the ZnO film.

A ZnO film was produced using the aforementioned production device (shown in FIG. 9). Production conditions are as follows. The partial pressure indicates the pressure in a near-field region just above the substrate surface (a region existing within 1 cm from the substrate surface). In this experiment, a quartz tube 10 was used as the reaction container 1.

Sample 1

Reaction container internal pressure=1 (atm)
Substrate 2: ZnO substrate
Common gas (A12): $Cl_2+N_2$
Third gas A3: $O_2+N_2$
Temperature T1=380 degrees C.
Temperature T2=400 degrees C.
Temperature T3=1,000 degrees C.
$ZnCl_2$ partial pressure=2.2E-4 (atm)
Zn partial pressure=8E-6 (atm)
$O_2$ partial pressure=5.1E-2 (atm)
$N_2$ partial pressure=9.5E-1 (atm)
Growth time=60 minutes
VI/II=447

Figure 11A:
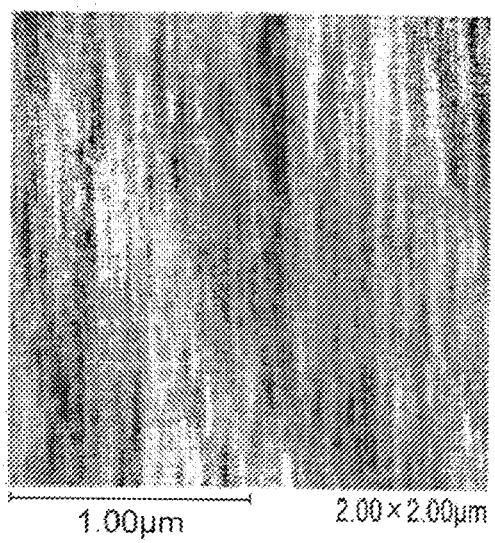
FIGS. 11A, 11B and 11C are views illustrating atomic force microscope (AFM) images of a surface of a ZnO film.
Figure 11B:
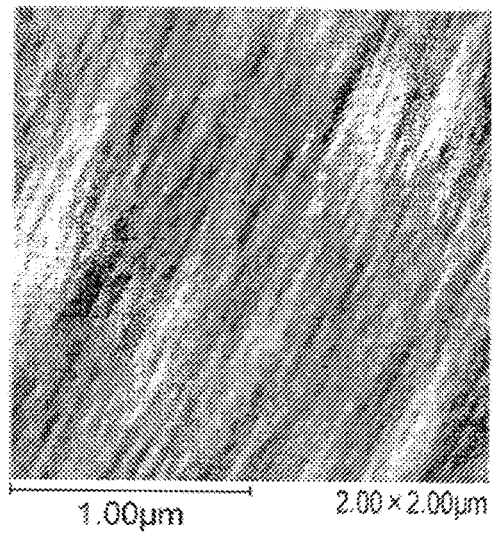
Figure 11C:
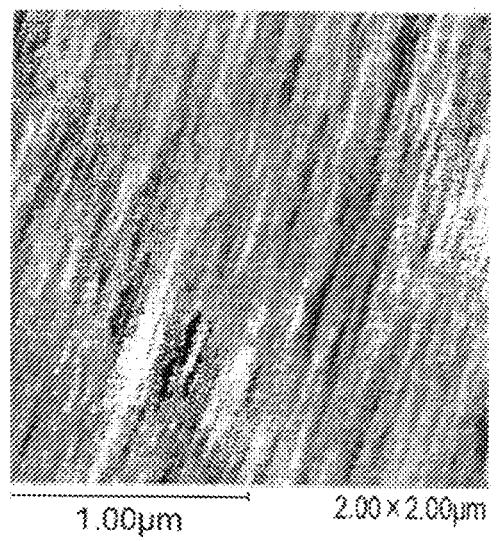

FIGS. 11A, 11B and 11C are views illustrating microscope images of the surface of the ZnO film produced using the aforementioned production device (shown in FIG. 9). The raw material gas supplied from the second raw material storing part R2 into the reaction container 1 reacts with an oxygen gas on the substrate surface. Thus, this reaction forms a ZnO film on the substrate. In FIGS. 11A, 11B and 11C, there are illustrated an upstream position of a raw material gas flow above the substrate surface (FIG. 11A), a midstream position (FIG. 11B) and a downstream position (FIG. 11C). In all cases, good morphology was observed. The surface roughness of the ZnO film was measured using an AFM (Atomic Force Microscope). In this case, the surface roughness (root-mean-square (RMS)) was 0.128 nm in the upstream position, 0.128 nm in the midstream position and 0.122 nm in the downstream position. That is to say, the surface roughness is constant regardless of the position, and also it was possible to obtain a highly smooth surface.

Figure 12A:
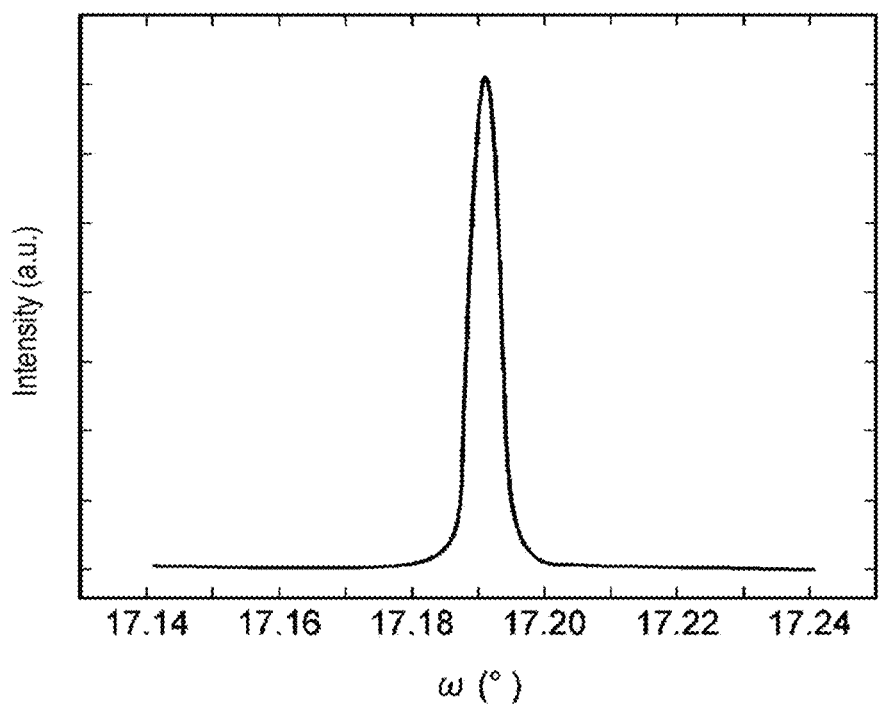
FIGS. 12A and 12B are graphs representing the relationship between the angle $\omega$ (°) of the X-ray diffraction direction with respect to the X-ray incidence direction in the X-ray diffraction measurement and the intensity (a.u.).
Figure 12B:
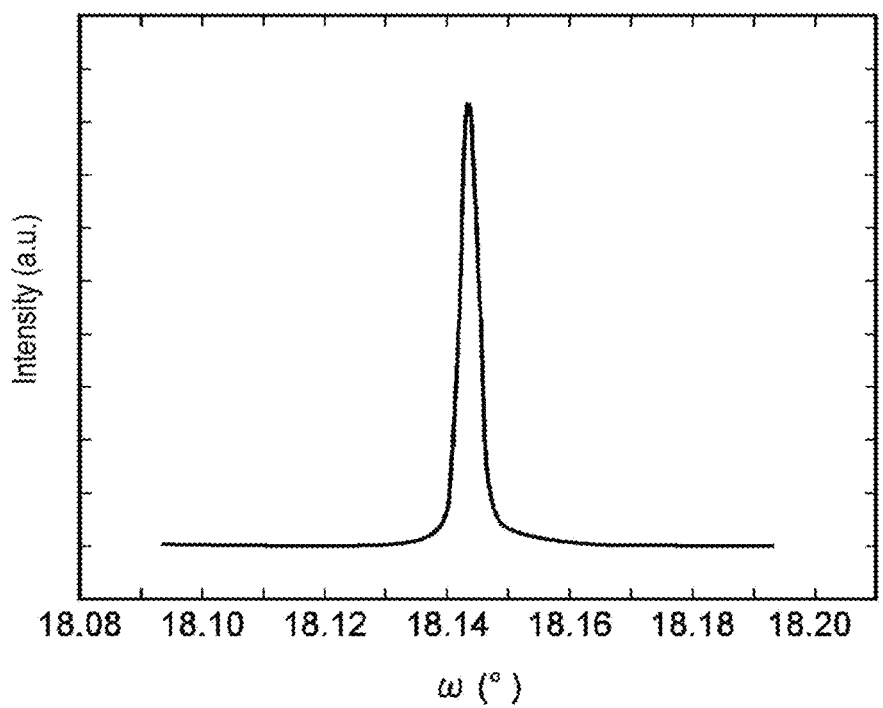

FIGS. 12A and 12B are graphs representing the relationship between the angle to ω (°) of the X-ray diffraction direction with respect to the X-ray incidence direction in the X-ray diffraction measurement and the intensity (a.u.). The measurement sample is the above Sample 1.

In the graph shown in FIG. 12A, the FWHM is 18 (arcsec). The measured crystal orientation (Tilt) of the ZnO film is (002). Even when compared with the FWHM of the substrate, this value remains substantially unchanged. It can be noted that a crystal having a very high quality was obtained. In all the samples, the FWHM of the X-ray diffraction peak with respect to the crystal orientation, i.e., the plane direction (002), of the ZnO substrate as a base is 17 (arcsec). The ZnO substrate as a base is a hydrothermally-synthesized n-type ZnO substrate.

In the graph shown in FIG. 12B, the FWHM is 13 (arcsec). The measured crystal orientation (Twist) of the ZnO film is (101). Even when compared with the FWHM of the substrate, this value remains substantially unchanged. It can be noted that a crystal having a very high quality was obtained. The FWHM of Patent Document 1 is 1,200 (arcsec) at most. It can be appreciated that, as compared with the conventional ZnO film, the ZnO film of the present embodiment has a very high quality.

In the case where only the ratio of VI/II (the molar concentration of oxygen (O) of Group VI/the molar concentration of zinc (Zn) of Group II) and the growth time are changed in the production conditions of Sample 1, the sample FWHM is as follows.

Sample 2

Reaction container internal pressure=1 (atm)
Substrate 2: ZnO substrate
Common gas (A12): $Cl_2+N_2$
Third gas A3: $O_2+N_2$
Temperature T1=380 degrees C.
Temperature T2=400 degrees C.
Temperature T3=1,000 degrees C.
$ZnCl_2$ partial pressure=2.2E-4 (atm)
Zn partial pressure=8E-6 (atm)
$O_2$ partial pressure=1.3E-1 (atm)
$N_2$ partial pressure=8.7E-1 (atm)
Growth time=60 minutes
VI/II=1,140

The case where the crystal orientation during the sample measurement is Tilt (002) is assumed to be (A). The case where the crystal orientation during the sample measurement is Twist (101) is assumed to be (B).
(A); FWHM=20 (arcsec)
(B); FWHM=13 (arcsec)

Sample 3

Reaction container internal pressure=1 (atm)
Substrate 2: ZnO substrate
Common gas (A12): $Cl_2+N_2$
Third gas A3: $O_2+N_2$
Temperature T1=380 degrees C.
Temperature T2=400 degrees C.
Temperature T3=1,000 degrees C.
$ZnCl_2$ partial pressure=2.2E-4 (atm)
Zn partial pressure=8E-6 (atm)
$O_2$ partial pressure=1.3E-1 (atm)
$N_2$ partial pressure=8.7E-1 (atm)
Growth time=360 minutes
VI/II=1,140

The case where the crystal orientation during the sample measurement is Tilt (002) is assumed to be (A). The case where the crystal orientation during the sample measurement is Twist (101) is assumed to be (B).
(A); FWHM=18 (arcsec)
(B); FWHM=13 (arcsec)

Sample 4

Reaction container internal pressure=1 (atm)
Substrate 2: ZnO substrate
Common gas (A12): $Cl_2+N_2$
Third gas A3: $O_2+N_2$
Temperature T1=380 degrees C.
Temperature T2=400 degrees C.
Temperature T3=1,000 degrees C.
$ZnCl_2$ partial pressure=2.2E-4 (atm)
Zn partial pressure=8E-6 (atm)

$O_2$ partial pressure=1.3E-1 (atm)
$N_2$ partial pressure=8.7E-1 (atm)
Growth time=540 minutes
VI/II=1,140

The case where the crystal orientation during the sample measurement is Tilt (002) is assumed to be (A). The case where the crystal orientation during the sample measurement is Twist (101) is assumed to be (B).

(A); FWHM=46 (arcsec)
(B); FWHM=30 (arcsec)

Figure 13B:
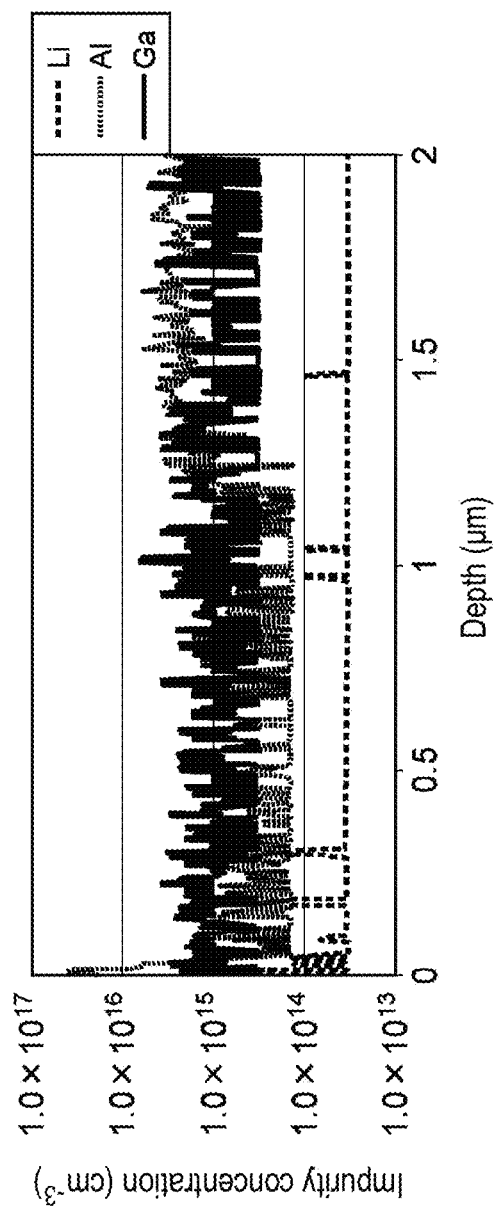

FIGS. 13A and 13B are graphs representing the relationship between the depth (μm) in the ZnO film and the impurity concentration ($cm^{-3}$). The ZnO film is Sample 3.

This measurement was carried out using a secondary ion mass spectrometer (SIMS). FIG. 13A shows a result of elemental analysis of H, C, Si and Cl conducted by irradiating $Cs^+$ ions. FIG. 13B shows a result of elemental analysis of Li, Al and Ga conducted by irradiating $O_2^+$ ions. It can be appreciated that the impurities such as C, H, Cl and the like exist at a background level and further that the ZnO film having a very high quality is formed. In FIG. 13B, the concentration of Al is increased. This is because the ZnO substrate is manufactured by a hydrothermal synthesis method and thereby Al is mixed. Al does not exist in the ZnO film. It can be noted that the thickness of the ZnO film is 1.27 μm.

Then, the C—V characteristics were evaluated.

Figure 14:
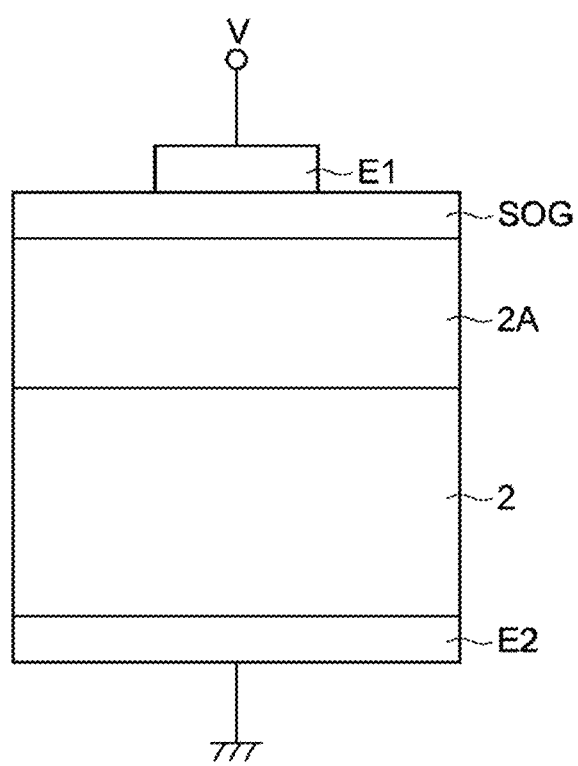
FIG. 14 is a view showing a structure of a MOS diode for C—V measurement.

FIG. 14 is a view showing a structure of a MOS diode for C—V measurement.

A ZnO film 2A was caused to grow on the ZnO substrate 2. An insulating film SOG was formed on the ZnO film 2A. An upper surface electrode E1 having a diameter of 100 μm was formed on the insulating film SOG using a mask. A lower electrode E2 was formed on the entire lower surface of the substrate 2. The thickness of the ZnO film 2A is 2.1 μm. The thickness of the insulating film SOG is 200 nm. Ti (10 nm) and Au (200 nm) were used as an electrode material. The electrodes were formed by a vapor deposition method. The insulating film SOG is a spin-on-glass material, namely OCDT-12 made by Tokyo Ohka Kogyo Co., Ltd. The insulating film SOG was formed by coating the spin-on-glass material and then heating the spin-on-glass material at 400 degrees C. for 30 minutes. This ZnO film is Sample 4.

The capacity ($F/cm^2$) was measured by connecting the lower surface electrode E2 to ground and changing the voltage applied to the upper surface electrode E1.

Figure 15:
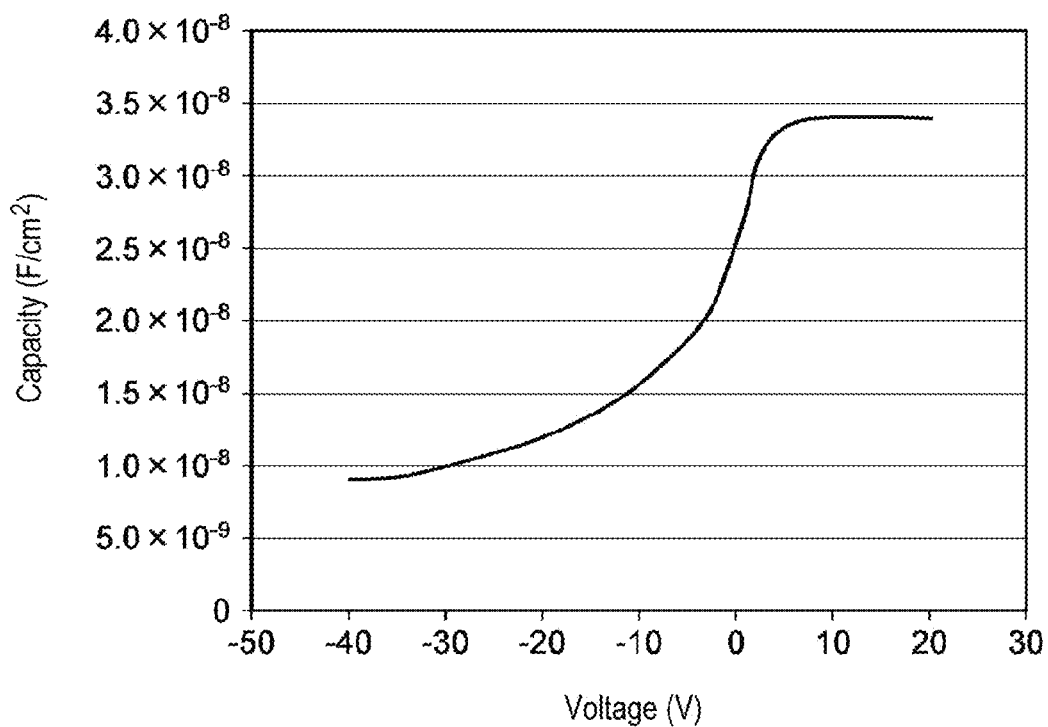
FIG. 15 is a graph representing the relationship between the voltage (V) and the capacity per unit area ($F/cm^2$).

FIG. 15 is a graph representing the relationship between the voltage (V) and the capacity per unit area ($F/cm^2$). If a positive voltage is applied, the capacity is increased and is saturated to a constant value at 5 V or higher. This reveals that the ZnO growth film is an n-type crystal. From this curve, it is possible to calculate a carrier concentration in an undoped case. In this case, the carrier concentration thus measured is $7.6 \times 10^{15}$ ($cm^{-3}$). It can be noted that the carrier concentration is sufficiently low and there is no large defect.

Figure 16:
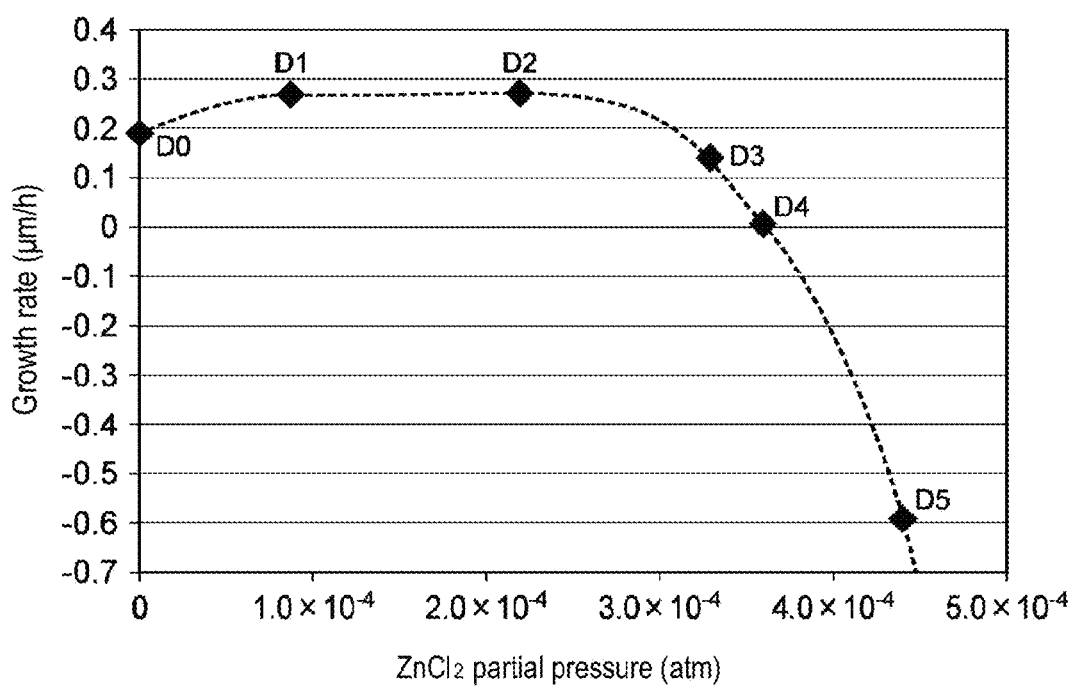
FIG. 16 is a graph representing the relationship between the $ZnCl_2$ partial pressure (atm) and the growth rate ($\mu$m/h).

FIG. 16 is a graph representing the relationship between the $ZnCl_2$ partial pressure (atm) and the growth rate (μm/h). The partial pressure indicates the pressure in a near-field region just above the substrate surface (a region existing within 1 cm from the substrate surface). Data D0 to D5 are plotted in the graph. Only data D4 is virtual data when the growth rate on a curve (dot line) estimated from the remaining actual measurement data D0, D1, D2, D3 and D5 is equal to 0 (μm/h).

Conditions for obtaining the respective data D0, D1, D2, D3 and D5 are as follows. The VI/II (the molar concentration of oxygen (O) of Group VI/the molar concentration of zinc (Zn) of Group II) was fixed to 1200, except Data D0.

Sample (Data D0)

Reaction container internal pressure=1 (atm)
Substrate 2: ZnO substrate
Common gas (A12): $Cl_2+N_2$
Third gas A3: $O_2+N_2$
Temperature T1=380 degrees C.
Temperature T2=400 degrees C.
Temperature T3=1,000 degrees C.
$ZnCl_2$ partial pressure=0 (atm)
Zn partial pressure=8E-6 (atm)
$O_2$ partial pressure=1.3E-1 (atm)
$N_2$ partial pressure=8.7E-1 (atm)
Growth time=60 minutes Sample (Data D1)

Reaction container internal pressure=1 (atm)
Substrate 2: ZnO substrate
Common gas (A12): $Cl_2+N_2$
Third gas A3: $O_2+N_2$
Temperature T1=380 degrees C.
Temperature T2=400 degrees C.
Temperature T3=1,000 degrees C.
$ZnCl_2$ partial pressure=8.8E-5 (atm)
Zn partial pressure=8E-6 (atm)
$O_2$ partial pressure=6.6E-2 (atm)
$N_2$ partial pressure=9.3E-1 (atm)
Growth time=60 minutes Sample (Data D2)

Reaction container internal pressure=1 (atm)
Substrate 2: ZnO substrate
Common gas (A12): $Cl_2+N_2$
Third gas A3: $O_2+N_2$
Temperature T1=380 degrees C.
Temperature T2=400 degrees C.
Temperature T3=1,000 degrees C.
$ZnCl_2$ partial pressure=2.2E-4 (atm)
Zn partial pressure=8E-6 (atm)
$O_2$ partial pressure=1.3E-1 (atm)
$N_2$ partial pressure=8.7E-1 (atm)
Growth time=60 minutes Sample (Data D3)

Reaction container internal pressure=1 (atm)
Substrate 2: ZnO substrate
Common gas (A12): $Cl_2+N_2$
Third gas A3: $O_2+N_2$
Temperature T1=380 degrees C.
Temperature T2=400 degrees C.
Temperature T3=1,000 degrees C.
$ZnCl_2$ partial pressure=3.3E-4 (atm)
Zn partial pressure=8E-6 (atm)
$O_2$ partial pressure=2E-1 (atm)
$N_2$ partial pressure=8E-1 (atm)
Growth time=60 minutes Sample (Data D5)

Reaction container internal pressure=1 (atm)
Substrate 2: ZnO substrate

Common gas (A12): $Cl_2+N_2$
Third gas A3: $O_2+N_2$
Temperature T1=380 degrees C.
Temperature T2=400 degrees C.
Temperature T3=1,000 degrees C.
$ZnCl_2$ partial pressure=4.4E-4 (atm)
Zn partial pressure=8E-6 (atm)
$O_2$ partial pressure=2.6E-1 (atm)
$N_2$ partial pressure=7.4E-1 (atm)
Growth time=60 minutes According to the aforementioned results, it can be noted that, if the supply amount of $Cl_2$ is increased, the growth rate decreases and the etching goes ahead.

When observing data D1 to D4, in order to make the ZnO film grow, in some embodiments the control device CONT controls the amount of the chlorine gas ($Cl_2$) supplied from the common gas supply source (chlorine gas supply source) G12. Thus, the control device CONT may set the partial pressure of a zinc chloride gas ($ZnCl_2$) to become equal to or higher than $8.8 \times 10^{-5}$ atm and equal to or lower than $3.6 \times 10^{-4}$ atm (the $ZnCl_2$ partial pressure in D4) in the near-field region just above the substrate surface. This is because, if the partial pressure of the zinc chloride gas is equal to or higher than the lower limit, the ZnO film grows. However, if the partial pressure of the zinc chloride gas exceeds the upper limit, the ZnO film begins to be etched and does not grow. As indicated by the data D0, the ZnO film grows even if the partial pressure of the zinc chloride gas ($ZnCl_2$) is 0 atm (or more).

When observing the data D1 to D3, in some embodiment the control device CONT controls the amount of the chlorine gas supplied from the common gas supply source (chlorine gas supply source) G12. Thus, the control device CONT may set the partial pressure of the zinc chloride gas ($ZnCl_2$) to become equal to or higher than $8.8 \times 10^{-5}$ atm and equal to or lower than $3.3 \times 10^4$ atm in the near-field region just above the substrate surface. This is because, if the partial pressure of the chlorine gas falls within the aforementioned range, the ZnO film sufficiently grows.

When observing the data D1 and D2, in some embodiments the control device CONT controls the amount of the chlorine gas supplied from the common gas supply source (chlorine gas supply source) G12. Thus, the control device may set the partial pressure of the zinc chloride gas to become equal to or higher than $8.8 \times 10^{-5}$ atm and equal to or lower than $2.2 \times 10^{-4}$ atm in the near-field region just above the substrate surface. This is because, if the partial pressure of the chlorine gas falls within the aforementioned range, the growth rate of the ZnO film becomes constant and stably controllable.

In the following, the observation of the ZnO film growth will be described.

Figure 17:
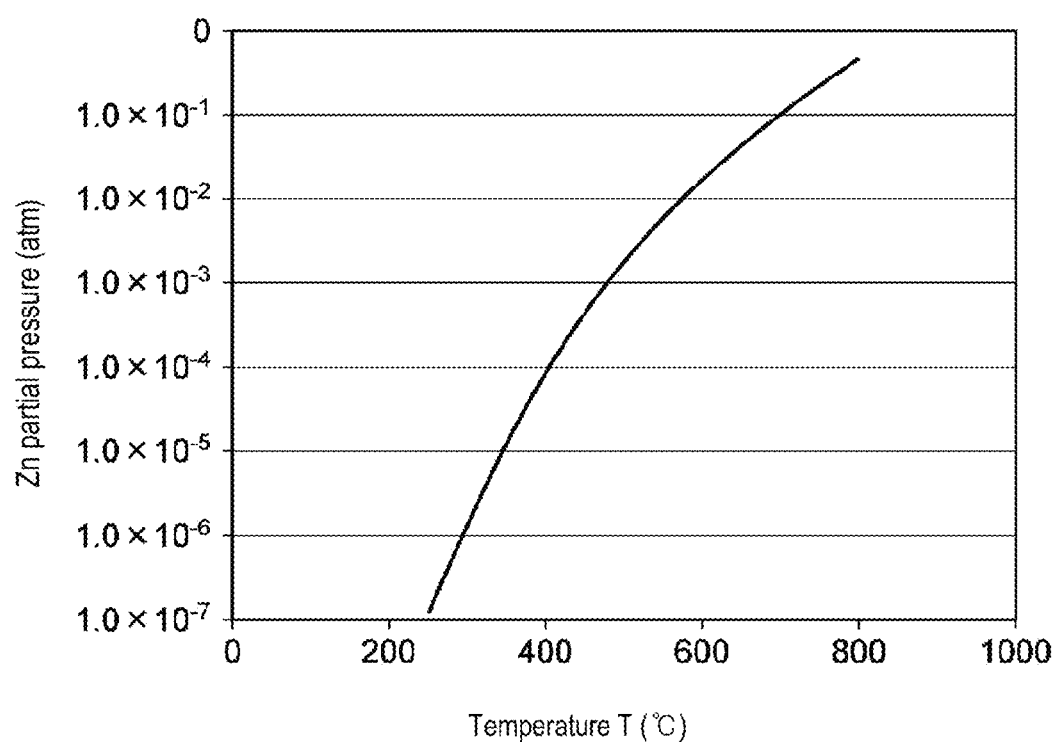
FIG. 17 is a graph representing the relationship between the temperature T (degrees C.) and the Zn partial pressure (atm).

FIG. 17 is a graph (vapor pressure curve) representing the relationship between the temperature T (degrees C.) and the Zn partial pressure (atm). As the temperature T increases, there is generated Zn which is directly sublimated from a solid raw material to become a gas. It can be noted that, if the temperature T exceeds 330 degrees C., Zn is gradually gasified.

Figure 18:
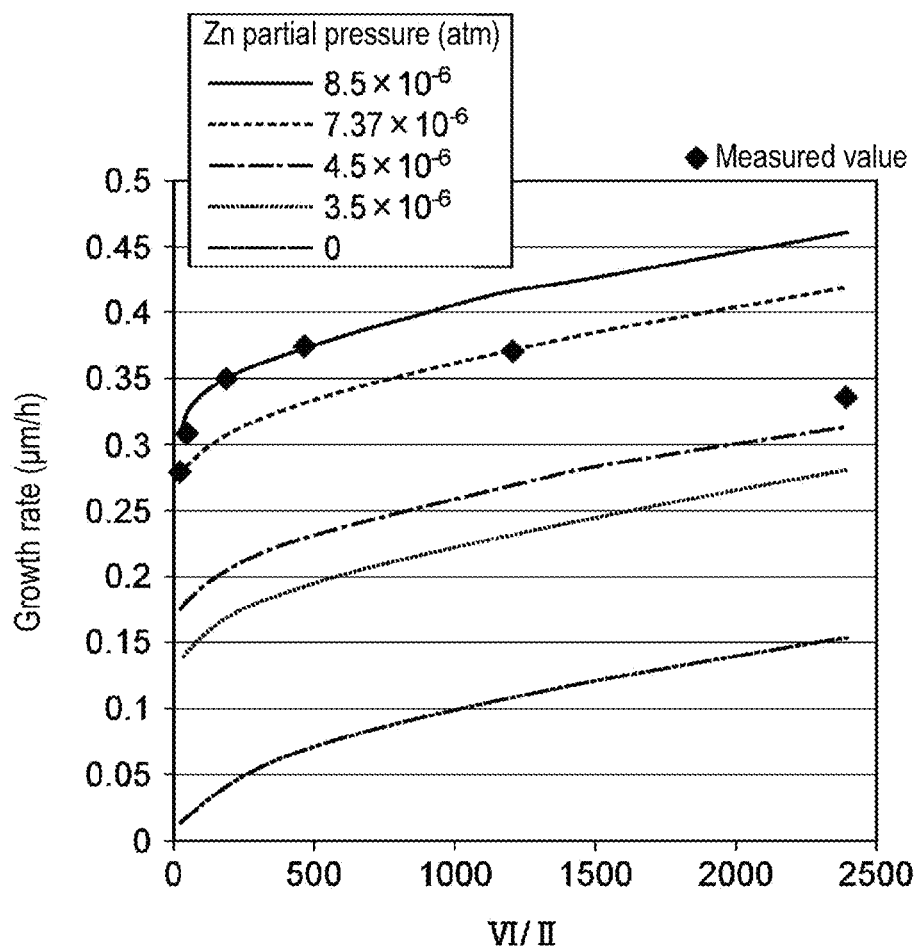
FIG. 18 is a graph representing the relationship between the VI/II and the growth rate ($\mu$m/h).

FIG. 18 is a graph representing the relationship between the VI/II and the growth rate (μm/h). The solid line is a theoretical curve found by calculation. It can be noted that, as the Zn partial pressure becomes higher, the growth rate increases. Data were measured by setting the temperature T3 of the ZnO substrate to become equal to 1,000 degrees C., setting the $Cl_2$ partial pressure in the raw material storing part to become $2.2 \times 10^{-4}$ (atm) and disposing metal Zn within the raw material storing part. The temperature T1 is equal to 380 degrees C. and the temperature T2 (average value) is equal to 400 degrees C. Other conditions remain the same as the formation conditions of sample 1.

In the case where the Zn partial pressure is 0 (atm), it may be considered that only the reaction (3) described above goes ahead. However, in reality, Zn is vaporized at a temperature of 330 degrees C. or higher. Thus, the reaction (4) also goes ahead. If the VI/II is 500 or less, the Zn partial pressure is $7.4 \times 10^{-6}$ to $8.5 \times 10^{-6}$ (atm). In the case where the VI/II is 1,000 or more, the growth rate decreases. Presumably, this is because the $O_2$ partial pressure increases and, therefore, Zn atoms react with $O_2$ in the gas phase.

Figure 19:
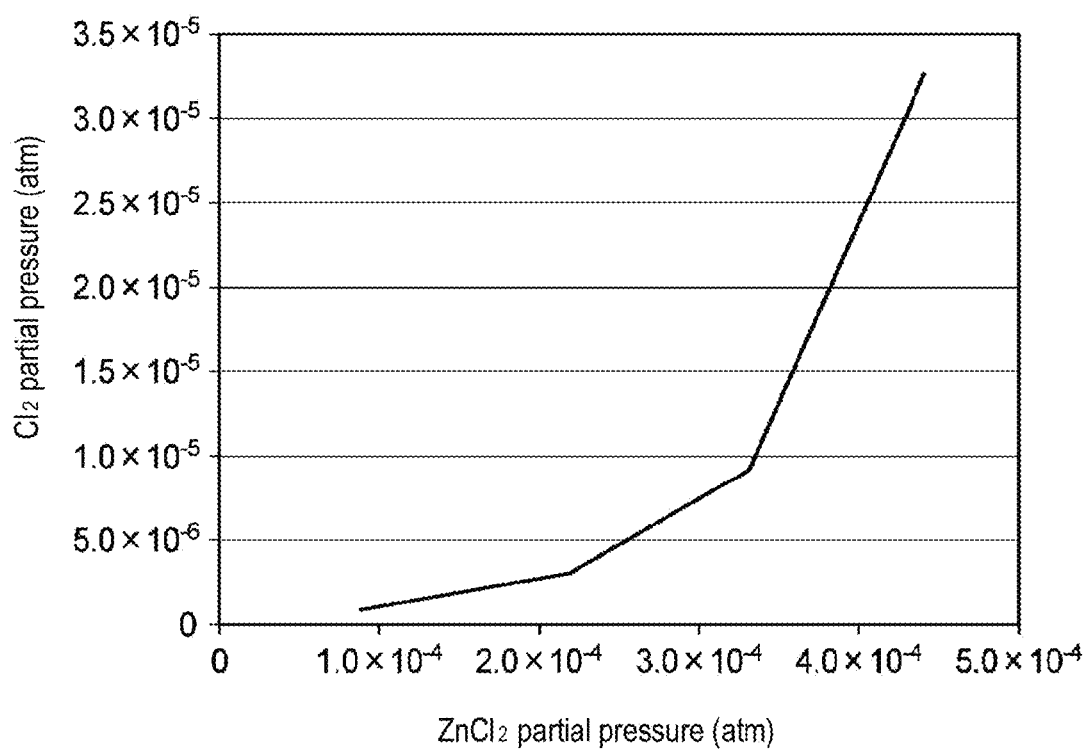
FIG. 19 is a graph representing the relationship between the $ZnCl_2$ partial pressure (atm) and the $Cl_2$ partial pressure (atm).

FIG. 19 is a graph representing the relationship between the $ZnCl_2$ partial pressure (atm) and the $Cl_2$ partial pressure (atm), both of which are found by thermal equilibrium analysis.

From the observation of the growth rate described above, it was found that, if the amount of $Cl_2$ increases, the growth rate decreases. The graph shown in FIG. 19 is calculated by adding the supply amount of unreacted $Cl_2$. This result reveals that, if the supply amount of $Cl_2$ is increased, $Cl_2$ not reacting with Zn increases. Thus, the ZnO film is found to be etched by the unreacted $Cl_2$.

Figure 20:
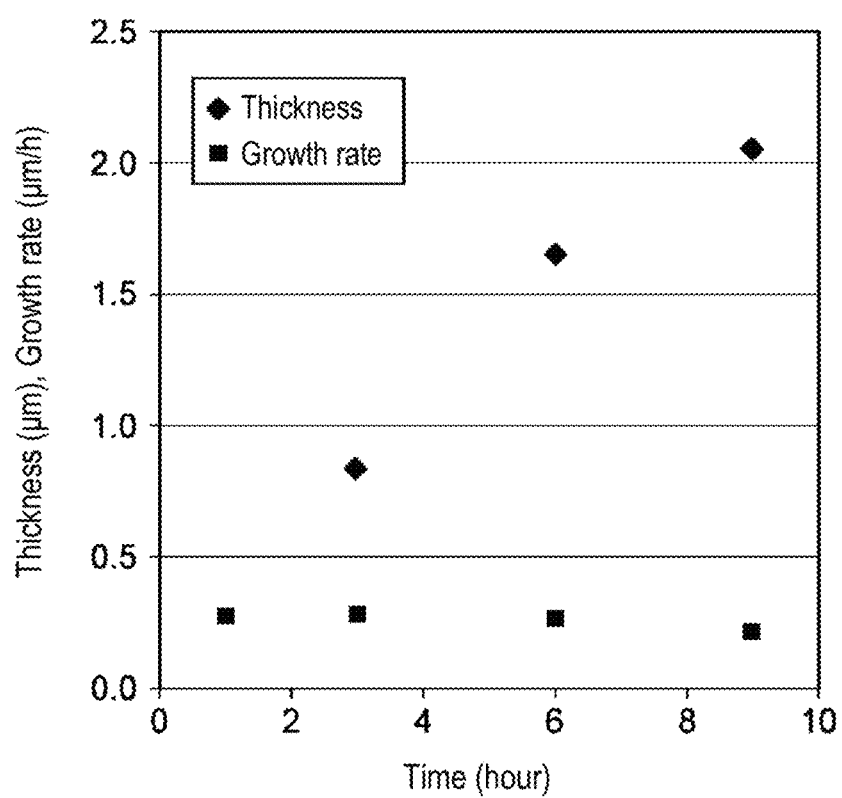
FIG. 20 is a graph representing the relationship between the deposition time (hour) of the ZnO film and the thickness (μm) and the growth rate (μm/h) of the ZnO film.

FIG. 20 is a graph representing the relationship between the deposition time (hour) of the ZnO film and the thickness (μm) and the growth rate (μm/h) of the ZnO film. The sample manufacturing conditions are the same as those of the data D2. It can be noted that, as time elapses, the thickness stably increases. That is to say, the growth rate is substantially constant.

Figure 21A:
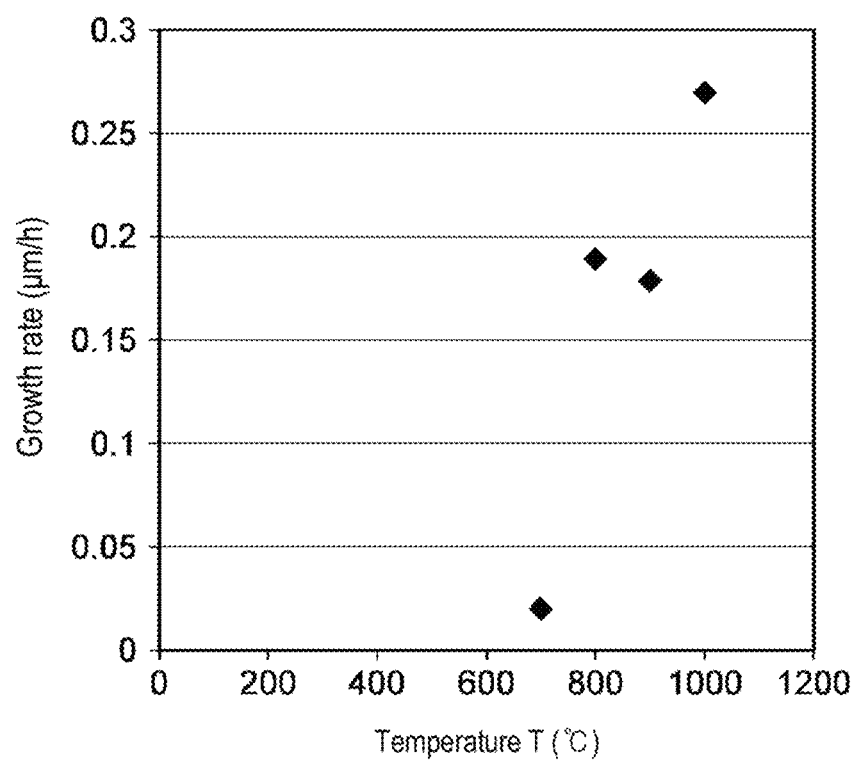
FIG. 21A is a graph representing the relationship between the temperature T (degrees C.) and the growth rate (μm/h)

FIG. 21A is a graph representing the relationship between the temperature T (degrees C.) and the growth rate (μm/h). The sample manufacturing conditions are the same as those of the data D2. The VI/II was set equal to 1,200 and the supply amount of $Cl_2$ was set at $2.2 \times 10^{-4}$ (atm). The substrate temperature T3 was changed. Accordingly, a clear trend is observed for the temperature. This reaction is believed to be a surface reaction rate limiting factor.

Figure 21B:
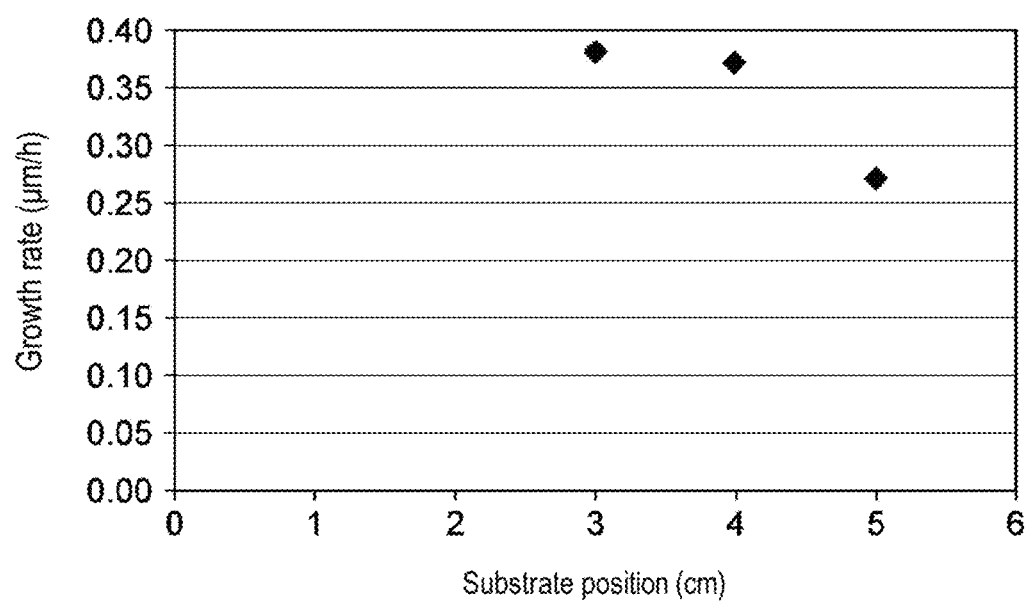
FIG. 21B is a graph representing the relationship between the substrate position (cm) and the growth rate (μm/h).

The aforementioned growth rate is the growth rate at the center of the substrate. FIG. 21B is a graph representing the relationship between the substrate position (cm) and the growth rate (μm/h). If the position on the substrate is far from the origin of the substrate position, the growth rate decreases slightly. In FIG. 21B, it is assumed that the origin of the substrate position is where $ZnCl_2$ is blown toward a growth region. Further, it is assumed that the substrate position grows larger toward the downstream side of the $ZnCl_2$ flow.

In addition, various kinds of data were measured. FIGS. 22 and 23 are tables showing the characteristics of the ZnO film for each of various conditions. The conditions of the sample are the same as the conditions of the sample of the data D2, except various kinds of variables (the temperature T3, the partial pressure (P($ZnCl_2$) near the substrate), the growth time (hour) and the VI/II). In the case where the variables are changed, the surface roughness RMS (nm), the FWHM (meV) of the near band edge emission (NBE) in the photoluminescence (PL) spectrum, and the degree of crystal defects (=the deep level emission intensity (Deep)/NBE intensity) were measured. In either case, it was confirmed that the FWHM is small and the degree of crystal defects is also small. Thus, it was found that a ZnO film having an extremely high quality is formed. The temperature T3 can be changed up to 800 to 1000 degrees C. The $ZnCl_2$ partial pressure can be changed up to $8.8 \times 10^{-5}$ to $3.3 \times 10^{-4}$ (atm). The time can be changed from 1 hour to 9 hours. The VI/II can be changed up to 20 to 2,400. In these cases, it was found that a ZnO film having superior characteristic is obtained.

Figure 24A:
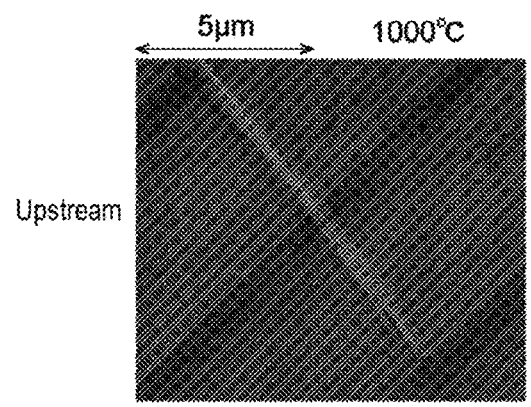
FIGS. 24A, 24B and 24C are views showing microphotographs of a substrate surface when only one raw material storing part is kept at a constant temperature.
Figure 24B:
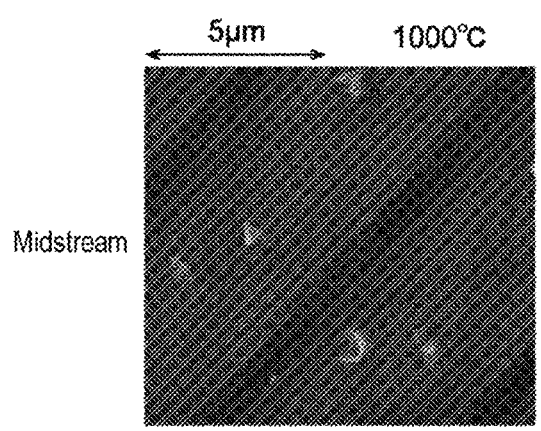
Figure 24C:
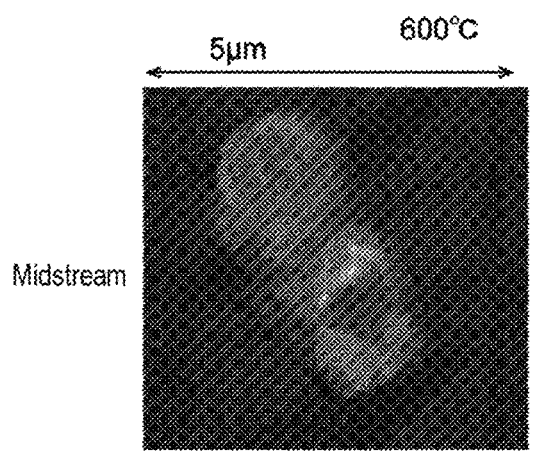

FIGS. 24A, 24B and 24C are views showing microphotographs of the ZnO substrate surface observed by the Nomarski differential interference microscope manufactured by Olympus Corporation. This example differs from the device shown in FIG. 7 in that the device of this example is provided with only the first raw material storing part kept at a constant temperature and is not provided with the second raw material storing part. The crystal growth of a ZnO film was attempted using this device. The growth temperatures are 1000 degrees C. and 600 degrees C. At the upstream and midstream sides of the substrate surface, ZnO did not grow. The substrate is made of sapphire. Other conditions remain the same as the conditions of the sample of the data D2.

Figure 25A:
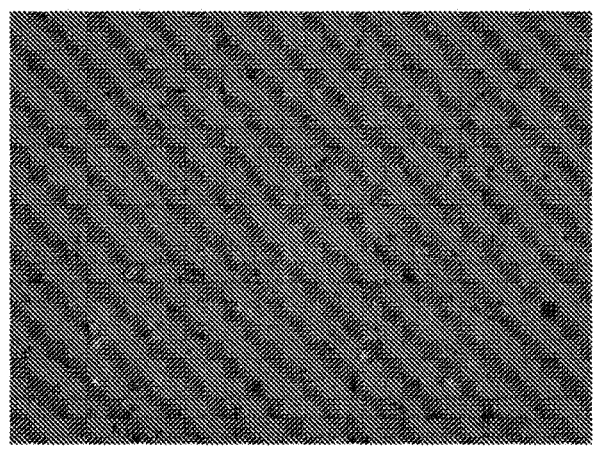
FIGS. 25A and 25B are views showing microphotographs of a substrate surface when only one raw material storing part is kept at a constant temperature (the microphotographs are taken by changing a chlorine gas concentration).
Figure 25B:
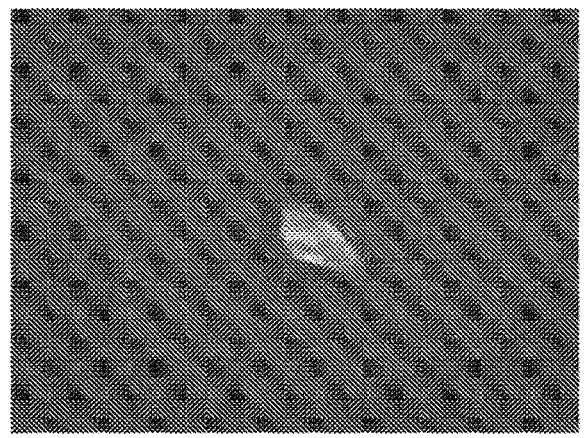

FIGS. 25A and 25B are views showing microphotographs of the ZnO substrate surface observed by the Nomarski differential interference microscope manufactured by Olympus Corporation. This example differs from the device shown in FIG. 7 in that the device of this example is provided with only the first raw material storing part kept at a constant temperature and is not provided with the second raw material storing part. The crystal growth of a ZnO film was attempted using this device. In FIGS. 25A and 25B, there are shown the states of the substrate surface for the respective cases where the concentration of a chlorine gas is changed. In the cases shown in FIGS. 24A, 24B and 24C, if the concentration (molar concentration) of the chlorine gas within the raw material storing part is increased from 0.2% to 10%, the growth is further suppressed. Thus, the ZnO film scarcely grew.

As described above, the ZnO film production method using the aforementioned production device includes: disposing the substrate 2 on the installation base 3; and, while supplying the chlorine gas from the chlorine gas supply source (G12, G1 or G2) to the first raw material storing part R1 and supplying the oxygen gas from the third gas supply source (oxygen gas supply source) G3 into the reaction container 1, controlling the heating units (heaters H1, H2 and H3) with the control device CONT such that the temperature T1 of the first raw material storing part R1, the temperature T2 of the second raw material storing part R2 and the temperature T3 of the installation base 3 on which the substrate 2 is disposed satisfy a relationship of $T1<T2<T3$. According to this production method, as described above, it is possible to produce a high-quality ZnO film.

The ZnO film production device described above includes: the installation base 3 configured to support the substrate on which a ZnO film is to be formed; the reaction container configured to accommodate the installation base 3; the first raw material storing part R1 configured to communicate with the interior of the reaction container and to store a solid raw material which contains Zn; the second raw material storing part R2 configured to communicate with the interior of the reaction container and to store a solid raw material which contains Zn; the heating units (heaters H1, H2 and H3) configured to heat the first and the second raw material storing parts R1 and R2; the first gas supply source configured to supply a chlorine-containing gas to at least the first raw material storing part R1, and the second gas supply source (the third gas supply source G3 described above) configured to supply an oxygen-containing gas into the reaction container, wherein the temperature T1 of the first raw material storing part R1 and the temperature T2 of the second raw material storing part R2 satisfy a relationship of $T1<T2$ during formation of the ZnO film. In this case, as described above, it is possible to produce a high-quality ZnO film. Instead of supplying a circulating gas to the second raw material storing part R2, the supply of the raw material stored in the second raw material storing part to the substrate may be performed heating the raw material and increasing the vapor pressure. It may also be possible to employ a structure in which the raw material is supplied by a molecular beam epitaxy (MBE) method. 1 atmospheric pressure (1 (atm): standard atmospheric pressure) is $1.01325\times10^5$ (Pa). An arbitrary atmospheric pressure A may be expressed by A (atm)=$A\times1.01325\times10^5$ (Pa).

EXPLANATION OF REFERENCE NUMERALS

3: installation base, 2: substrate, CONT: control device, G1: carrier gas supply source, G2: chlorine gas supply source, G3: oxygen gas supply source, 1: reaction container, R1: first raw material storing part, R2: second raw material storing part, H1, H2, H3: heater (heating units)

What is claimed is:
1. A ZnO film production system, comprising:
an installation base configured to support a substrate on which a ZnO film is to be formed;
a reaction container configured to accommodate the installation base;
a first raw material storing part configured to communicate with an interior of the reaction container and to store a solid first raw material which contains Zn;
a second raw material storing part configured to communicate with the interior of the reaction container and to store a solid raw second material which contains Zn;
heating units configured to heat the installation base, the first and the second raw material storing parts;
a chlorine gas supply source configured to supply a chlorine gas to at least the first raw material storing part;
an oxygen gas supply source configured to supply an oxygen gas into the reaction container; and a control device,
wherein the control device is configured to control the heating units such that a temperature T1 of the first raw material storing part, a temperature T2 of the second raw material storing part and a temperature T3 of the installation base on which the substrate is disposed satisfy a relationship of $T1<T2<T3$ during formation of the ZnO film,
the control device is configured to supply a flow rate of the chlorine gas supplied from the chlorine gas supply source to the first raw material storing part,
the control device is configured to supply a flow rate of the oxygen gas supplied from the oxygen gas supply source into the reaction container, and
the first and the second raw material storing parts are arranged adjacent to one another such that the first and the second raw material storing parts are configured to allow the chlorine gas first to pass through the first raw material storing part and next pass through the second raw material storing part before reaching the substrate, and the first and the second raw material storing parts have a bottom surface inclined such that a depth of the first and the second raw material storing parts grows larger toward a side of the second raw material storing part having a gas injection port, the depth of the first and the second raw material storing parts is measured from a horizontal surface positioned above the bottom surface of the first and the second raw material storing parts.

2. The system of claim 1, wherein the control device controls an amount of the chlorine gas supplied from the chlorine gas supply source and sets a partial pressure of a zinc chloride gas to become $8.8 \times 10^{-5}$ atm or more and $3.6 \times 10^{-4}$ atm or less in a near-field region above a surface of the substrate.

3. The system of claim 1, wherein the control device controls an amount of the chlorine gas supplied from the chlorine gas supply source and sets a partial pressure of a zinc chloride gas to become $8.8 \times 10^{-5}$ atm or more and $3.3 \times 10^{-4}$ atm or less in a near-field region above a surface of the substrate.

4. The system of claim 1, wherein the control device controls an amount of the chlorine gas supplied from the chlorine gas supply source and sets a partial pressure of a zinc chloride gas to become $8.8 \times 10^{-5}$ atm or more and $2.2 \times 10^{4}$ atm or less in a near-field region above a surface of the substrate.

5. A ZnO film production method for producing a ZnO film using a ZnO film production system, where said ZnO film production system includes:
   an installation base configured to support a substrate on which the ZnO film is to be formed;
   a reaction container configured to accommodate the installation base;
   a first raw material storing part configured to communicate with an interior of the reaction container and to store a solid first raw material which contains Zn;
   a second raw material storing part configured to communicate with the interior of the reaction container and to store a solid second raw material which contains Zn;
   heating units configured to heat the installation base, the first and the second raw material storing parts;
   a chlorine gas supply source configured to supply a chlorine gas to at least the first raw material storing part;
   an oxygen gas supply source configured to supply an oxygen gas into the reaction container; and
   a control device,
   wherein the control device is configured to control the heating units such that a temperature T1 of the first raw material storing part, a temperature T2 of the second raw material storing part and a temperature T3 of the installation base on which the substrate is disposed satisfy a relationship of T1<T2<T3 during formation of the ZnO film,
   the control device is configured to control a flow rate of the chlorine gas supplied from the chlorine gas supply source to the first raw material storing part,
   the control device is configured to supply a flow rate of the oxygen gas supplied from the oxygen gas supply source into the reaction container, and
   the first and the second raw material storing parts are arranged adjacent to one another such that the first and the second raw material storing parts are configured to allow the chlorine gas to first pass through the first raw material storing part and then pass through the second raw material storing part, and the first and the second raw material storing parts have a bottom surface inclined such that a depth of the first and the second raw material storing parts grows larger toward a side of the second raw material storing part having a gas injection port, the depth of the first and the second raw material storing parts is measured from a horizontal surface positioned above the bottom surface of the first and the second raw material storing parts,
   the method comprising:
   disposing the substrate on the installation base; and
   while supplying the chlorine gas from the chlorine gas supply source to the first raw material storing part and supplying the oxygen gas from the oxygen gas supply source into the reaction container, controlling the heating units with the control device such that the temperature T1 of the first raw material storing part, the temperature T2 of the second raw material storing part and the temperature T3 of the installation base on which the substrate is disposed satisfy a relationship of T1<T2<T3.

* * * * *